United States Patent
Hu et al.

(10) Patent No.: US 9,716,137 B1
(45) Date of Patent: Jul. 25, 2017

(54) 3D CAPACITOR WITH 3D MEMORY

(71) Applicant: MACRONIX INTERNATIONAL CO., LTD., Hsinchu (TW)

(72) Inventors: Chih-Wei Hu, Miaoli (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/285,808

(22) Filed: Oct. 5, 2016

(51) Int. Cl.
*H01L 23/52* (2006.01)
*H01L 49/02* (2006.01)
*H01L 27/11556* (2017.01)
*H01L 27/11582* (2017.01)

(52) U.S. Cl.
CPC ........ *H01L 28/90* (2013.01); *H01L 27/11556* (2013.01); *H01L 27/11582* (2013.01)

(58) Field of Classification Search
CPC .................... H01L 27/11556; H01L 27/11582
See application file for complete search history.

(56) References Cited

U.S. PATENT DOCUMENTS

| | | | |
|---|---|---|---|
| 6,034,882 A | 3/2000 | Johnson et al. | |
| 6,063,688 A | 5/2000 | Doyle et al. | |
| 6,366,519 B1 | 4/2002 | Hung et al. | |
| 6,906,940 B1 | 6/2005 | Lue | |
| 6,933,224 B2 | 8/2005 | Nejad et al. | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,301,818 B2 | 11/2007 | Lu et al. | |
| 7,382,647 B1 | 6/2008 | Gopalakrishnan | |
| 7,495,294 B2 | 2/2009 | Higashitani | |
| 7,646,625 B2 | 1/2010 | Philipp et al. | |
| 7,742,338 B2 | 6/2010 | Santin et al. | |
| 7,851,849 B2 | 12/2010 | Kiyotoshi | |
| 7,902,035 B2 | 3/2011 | Yu et al. | |
| 7,915,667 B2 | 3/2011 | Knoefler et al. | |
| 8,154,128 B2 | 4/2012 | Lung | |

(Continued)

FOREIGN PATENT DOCUMENTS

| | | |
|---|---|---|
| EP | 1936681 A1 | 6/2008 |
| EP | 2048709 A2 | 4/2009 |
| WO | 2004025659 A1 | 3/2004 |

OTHER PUBLICATIONS

Ahn, S. J. et al., "A Highly Manufacturable High Density Phase Change Memory of 64 Mb and Beyond," IEEE IEDM Dec. 13-15, 2004, pp. 907-910.

(Continued)

*Primary Examiner* — Benjamin Sandvik
(74) *Attorney, Agent, or Firm* — Haynes Beffel & Wolfeld LLP

(57) ABSTRACT

An integrated circuit includes 3D memory blocks and 3D capacitor blocks. The 3D capacitor comprises a plurality of stacks of conductive strips alternating with insulating strips, and a first terminal connected to conductive strips in consecutive levels in one or more stacks, whereby the conductive strips act as a first plate of the 3D capacitor. A second terminal is insulated from the first terminal, either connected to conductive strips in consecutive levels in another or other stacks, or connected to a plurality of pillars. No intervening conductive strip is disposed between the conducive strips in consecutive levels.

18 Claims, 35 Drawing Sheets

(56) References Cited

U.S. PATENT DOCUMENTS

| | | |
|---|---|---|
| 8,208,279 B2 | 6/2012 | Lue |
| 8,383,512 B2 | 2/2013 | Chen et al. |
| 8,488,387 B2 | 7/2013 | Lue et al. |
| 8,598,032 B2 | 12/2013 | Chen et al. |
| 8,743,611 B2 * | 6/2014 | Hioka ............... G11C 16/0483 365/185.11 |
| 8,824,212 B2 | 9/2014 | Lue |
| 8,891,293 B2 | 11/2014 | Du et al. |
| 8,933,502 B2 | 1/2015 | Higashitani et al. |
| 8,941,166 B2 | 1/2015 | Chen et al. |
| 9,048,341 B2 | 6/2015 | Chen et al. |
| 9,070,434 B2 * | 6/2015 | Hioka ................... G11C 5/063 |
| 9,190,499 B2 * | 11/2015 | Hirai ............... H01L 29/66833 |
| 9,336,878 B2 | 5/2016 | Khwa et al. |
| 2003/0025147 A1 | 2/2003 | Nomoto et al. |
| 2005/0280061 A1 | 12/2005 | Lee |
| 2007/0215874 A1 | 9/2007 | Furukawa et al. |
| 2008/0006869 A1 | 1/2008 | Kamigaichi et al. |
| 2008/0073635 A1 | 3/2008 | Kiyotoshi et al. |
| 2008/0101109 A1 | 5/2008 | Haring-Bolivar et al. |
| 2009/0045445 A1 | 2/2009 | Yang et al. |
| 2009/0097321 A1 | 4/2009 | Kim et al. |
| 2009/0109737 A1 | 4/2009 | Kostylev |
| 2009/0184360 A1 | 7/2009 | Jin et al. |
| 2009/0230449 A1 * | 9/2009 | Sakaguchi .......... H01L 27/0688 257/298 |
| 2009/0261479 A1 | 10/2009 | Hong |
| 2010/0244269 A1 | 9/2010 | Kim |
| 2010/0270593 A1 | 10/2010 | Lung et al. |
| 2011/0051507 A1 | 3/2011 | Sarkar et al. |
| 2011/0080781 A1 | 4/2011 | Goux |
| 2011/0084397 A1 | 4/2011 | Lung |
| 2011/0140070 A1 | 6/2011 | Kim |
| 2011/0235403 A1 | 9/2011 | Kang |
| 2012/0182807 A1 | 7/2012 | Lue |
| 2012/0327708 A1 | 12/2012 | Du et al. |
| 2013/0051126 A1 | 2/2013 | Kwong |
| 2013/0113033 A1 | 5/2013 | Choi et al. |
| 2013/0126957 A1 * | 5/2013 | Higashitani ....... H01L 27/11519 257/314 |
| 2013/0130468 A1 | 5/2013 | Higashitani et al. |
| 2014/0198582 A1 | 7/2014 | Freeman |
| 2014/0226388 A1 | 8/2014 | Khoueir et al. |
| 2015/0318296 A1 * | 11/2015 | Kim ................... H01L 27/1157 257/296 |
| 2017/0053932 A1 * | 2/2017 | Jeon ................. H01L 27/11582 |

OTHER PUBLICATIONS

Chen C-H et al., "Age-Based PCM Wear Leveling with Nearly Zero Search Cost," 49th ACM/EDAC/IEEE Design Automation Conference (DAC), San Francisco, Jun. 2012, pp. 453-458.

Chen, An et al., "Non-Volatile Resistive Switching for Advanced Memory Applications," IEEE IEDM, Dec. 5-7, 2005, 4 pp.

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223.

Gleixner, "Phase Change Memory Reliability", 22nd NVSMW, Aug. 26, 2007, 46 pages.

Hsu et al., "Study of Sub-30nm Thin Film Transistor (TFT) Charge-Trapping (CT) Devices for 3D NAND Flash Application", IEDM 2009 IEEE International, Dec. 7-9, 2009, p. 1-4.

Hubert et al., "A Stacked SONOS technology, up to 4 levels and 6nm crystalline nanowires, with gate-all-around or independent gates (F Flash), suitable for full 3D integration", IEEE IEDM, Dec. 7-9, 2009, 2 pages.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-MB PROM With a Three-Dimensional Array of Diode/Anti-fuse Memory Cells" IEEE J. of Solid-State Circuits, vol. 38, No. 11, Nov. 2003.

Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Khwa, W. S., et al.; A Novel Inspection and Annealing Procedure to Rejuvenate Phase Change Memory from Cycling-Induced Degradations for Storage ClassMemory Applications; Electron Devices Meeting (IEDM), 2014 IEEE International; Jun. 18, 2014; 3 pgs.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim, Jiyoung et al., "Novel 3-D Structure for Ultra High Density Flash Memory with VRAT (Vertical-Recess-Array-Transistor) and PIPE (Planarized Integration on the same PlanE)," Jun. 17-19, 2008, 2 pages.

Kim, Kinam et al., "Reliability Investigations for Manufacturable High Density PRAM," IEEE 43rd Annual International Reliability Physics Symposium, San Jose, Apr. 17-21, 2005, pp. 157-162.

Lacita, A. L., "Electrothermal and Phase-change Dynamics in Chalcogenide-based Memories," IEEE IEDM Dec. 13-15, 2004, 4 pp.

Lai et al., "Highly Reliable MA BE-SONOS (Metal Al2O3 Bandgap Engineered SONOS) Using a SiO2 Buffer Layer", VLSI Technology, Systems and Applications, International Symposium on Apr. 21-23, 2008, p. 58-59.

Lai, et al., "A Multi-Layer Stackable Thin-Film Transistor (TFT) NAND-Type Flash Memory", IEEE Int'l Electron Devices Meeting, Dec. 11-13, 2006.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming et al.; Temperature dependence on the contact size of GeSbTe films for phase change memories; published online: Jan. 23, 2008; J Comput Electron (2008) 7: pp. 138-141.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Paul et al., "Impact of a Process Variation on Nanowire and Nanotube Device Pertormance", IEEE Transactions on Electron Devices, vol. 54, No. 9, Sep. 2007, p. 2369-2376.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Tanaka, H., et al., "Bit Cost Scalable Technology with Punch and Plug Process for Ultra High Density Flash Memory," 2007 IEEE Symposium on VLSI Technology, Jun. 12-14, 2007, pp. 14-15.

Wikipedia, Double Patterning, downloaded on Jul. 29, 2010, 14 pages.

Xie et al., "Analysis of Higher-Order Pitch Division for Sub-32nm Lithography," Proc. SPIE 7274, Optical Microlithography XXII, 72741Y (Mar. 16, 2009), 8 pages.

* cited by examiner

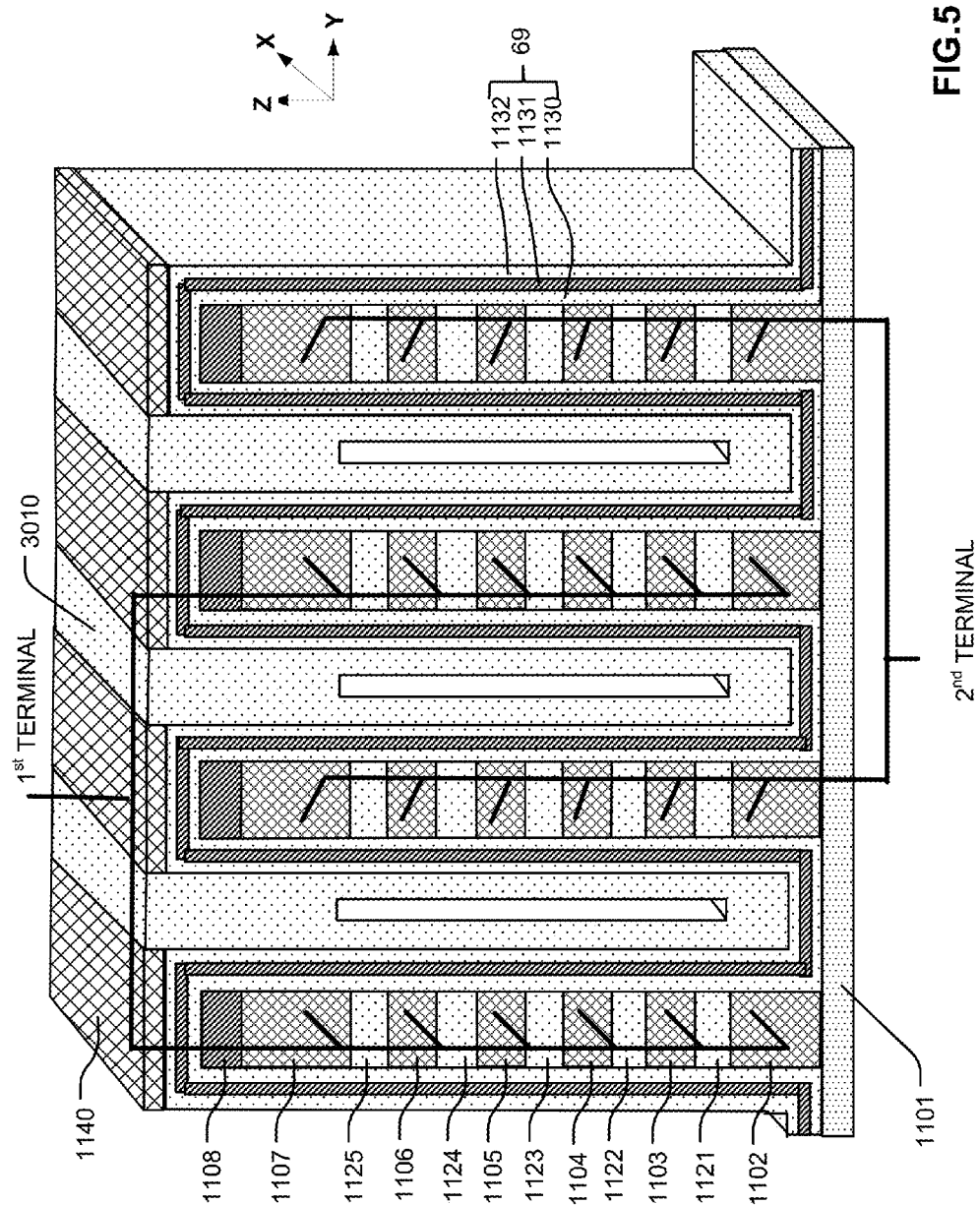

3D CAPACITOR WITH 3D MEMORY

CROSS-REFERENCE TO OTHER APPLICATIONS

This application is related to the following U.S. patent application Ser. No. 14/739,717, filed 15 Jun. 2015, entitled CAPACITOR WITH 3D NAND MEMORY.

BACKGROUND

Technical Field

The present application relates to memory devices, and particularly to 3D array memory devices in which include 3D capacitors.

Description of Related Art

As critical dimensions of devices in integrated circuits shrink to the limits of common memory cell technologies, designers look for techniques to stack multiple levels of memory cells to achieve greater storage capacity and lower costs per bit. Therefore, various three-dimensional structures are developed, such as vertical channel and vertical gate NAND memories. Capacitors can be used to help reduce voltage variations and can be used to help save data in memories, such as SRAM, DRAM and Flash, either during normal operations or due to unexpected power failures. In the program and erase operation, the bias voltages applies to word lines/bit lines using charge pumps to elevate the voltage at a high voltage level, which requires high capacitance. However, conventional capacitors providing large capacitance take a large area footprint, which in turn affects the scalability of the memory device.

It is desirable to provide a capacitor including stable yet large capacitance, but having a reduced area without increasing manufacturing cost.

SUMMARY

A 3D capacitor described comprises a plurality of stacks of conductive strips alternating with insulating strips, a first terminal connected to conductive strips in consecutive levels in the stacks in a first set of every other stack in the plurality of stacks, and a second terminal connected to conductive strips in consecutive levels in the stacks in a second set of every other stack in the plurality of stacks, wherein the stacks in the first set of every other stack are interdigitated with the stacks in the second set of every other stack. The conductive strips in consecutive levels in the stacks in the first set of every other stack are conductively and passively connected together and act as a first plate of the 3D capacitor, and the conductive strips in consecutive levels in the stacks in the second set of every other stack are conductively and passively connected together and act as a second plate of the 3D capacitor. No intervening conductive strip is disposed between the conductive strips in consecutive levels in the stacks in the first set of every other stack. Likewise, no intervening conductive strip is disposed between the conductive strips in consecutive levels in the stacks in the second set of every other stack.

A 3D capacitor described comprises one or more stacks of conductive strips alternating with insulating strips, a plurality of pillars respectively including a vertical conductive film and a first insulator, a first terminal connected to conductive strips in the one or more stacks, and a second terminal connected to the vertical conductive films in the plurality of pillars. The conductive strips in the one or more stacks are conductively and passively connected together and act as a first plate of the 3D capacitor, and the vertical conductive films in the plurality of pillars are conductively and passively connected together and act as the second plate of the 3D capacitor.

In one aspect, the plurality of pillars can be disposed on sides of the one or more stacks.

In another one aspect, the plurality of pillars can be disposed through the conductive strips in one stack. Also, the plurality of pillars can have a twisted or honeycomb arrangement.

In yet another one aspect, the 3D capacitor described herein can effectively suppress the variable parasitic capacitance and is able to withstand voltages greater than 30V.

Methods for manufacturing the 3D capacitor as described herein are also provided. A method for manufacturing a 3D capacitor includes forming a plurality of stacks of conductive strips alternating with insulating strips, forming a first terminal connected to conductive strips in consecutive levels in the stacks in a first set of every other stack in the plurality of stacks, and forming a second terminal connected to conductive strips in consecutive levels in the stacks in a second set of every other stack in the plurality of stacks, wherein the stacks in the first set of every other stack are interdigitated with the stacks in the second set of every other stack.

A method for manufacturing a 3D capacitor includes forming one or more stacks of conductive strips alternating with insulating strips, forming a plurality of pillars respectively including a vertical conductive film and a first insulator, forming a first terminal connected to conductive strips in the one or more stacks, and forming a second terminal connected to the vertical conductive films in the plurality of pillars.

Other features, aspects and advantages of the technology described herein can be understood with references to the figures, the detailed description and the claims set out follow.

BRIEF DESCRIPTION OF THE DRAWINGS

FIGS. 5-5A illustrate perspective views of a 3D capacitor according to the first embodiment.

DETAILED DESCRIPTION

A detailed description of embodiments of the present application is provided with reference to the FIGS. 3-33.

Figure 1:
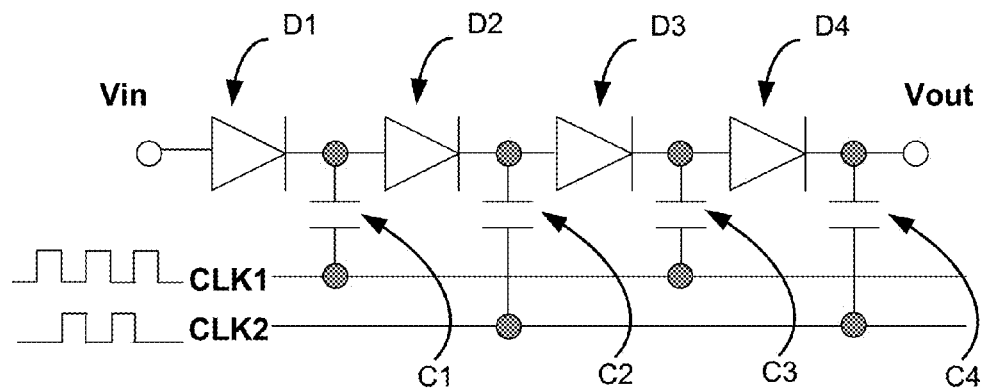
FIG. 1 is a simplified charge pump schematic diagram known in the prior art.

FIG. 1 illustrates a simplified schematic diagram of a charge pump. The charge pump is used to boost a lower input voltage Vin to a higher output voltage Vout. As illustrated in schematic diagram, the charge pump uses diodes D1-D4 to control the connection of voltages to the capacitors C1-C4 using opposite clocks CLK1, CLK2. In an ideal condition without taking the current leakage or other factors into consideration, when CLK1 is low, D1 will charge C1 to Vin. When CLK1 goes high the first terminal of C1 is pushed up to 2Vin. D1 is then turned off and D2 turned on and C2 begins to charge to 2Vin. On the next clock cycle, CLK1 again goes low and now CLK2 goes high pushing the first terminal of C2 to 3Vin. D2 switches off and D3 switches on, charging C3 to 3Vin. Repeatedly, Vout will be charging up to 5Vin for this four-stage charge pump. FIG. 1 is a simplified charge pump schematic diagram, and other charge pumps can be implemented as described in U.S. Pat. No. 6,366,519 B1, entitled REGULATED REFERENCE VOLTAGE CIRCUIT FOR FLASH MEMORY DEVICE AND OTHER INTEGRATED CIRCUIT APPLICATIONS, by Hung et al., which application is incorporated by reference as if fully set forth herein.

Figure 2:
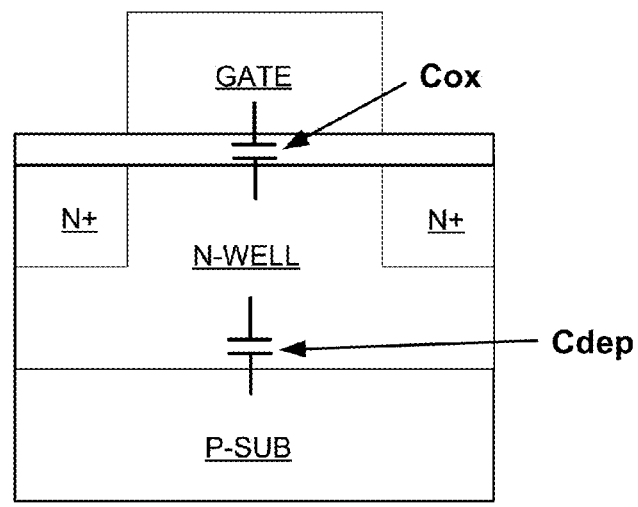
FIG. 2 illustrates a conventional MOS capacitor having parasitic capacitance known in the prior art.

FIG. 2 illustrates a MOS capacitor, commonly used in the charge pumps, having an N-well and N+ doped source/drain in a P-substrate. To have large capacitance Cox, the MOS capacitor needs large area for the plates, such as the gate and N-well. The MOS capacitor inevitably includes a parasitic capacitance Cdep caused by the N-well and P-substrate. The parasitic capacitance Cdep changes with increasing the applied voltage to the N-well, which in turn causes high power consumption and results in unstable and inconsistent capacitance.

Figure 3:
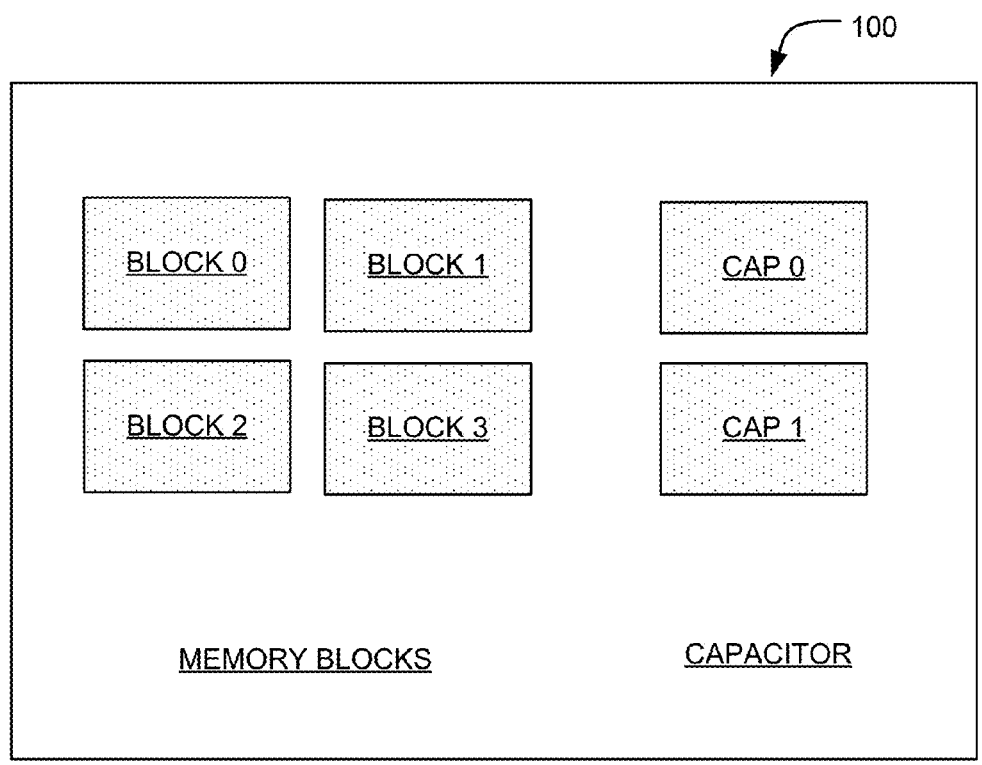
FIG. 3 is a block diagram of a 3D NAND memory 100 comprising 3D memory blocks and capacitors as described herein.

FIG. 3 is a simplified block diagram of a 3D NAND memory device 100 comprising 3D memory blocks (e.g. BLOCK 0-3) and 3D capacitors (e.g. CAP 0-1) formed on a same substrate. The 3D capacitor can be used in charge pumps to supply bias voltages needed for read, erase, and program operations of the memory device 100. The 3D capacitor can also be implemented in other circuits, such as back-up power sources. The 3D NAND memory blocks and 3D capacitors both have a plurality of stacks, and the manufacturing processes are mostly compatible, including many shared deposition and etch steps, so complexity and cost is not appreciably increased.

Figure 4:
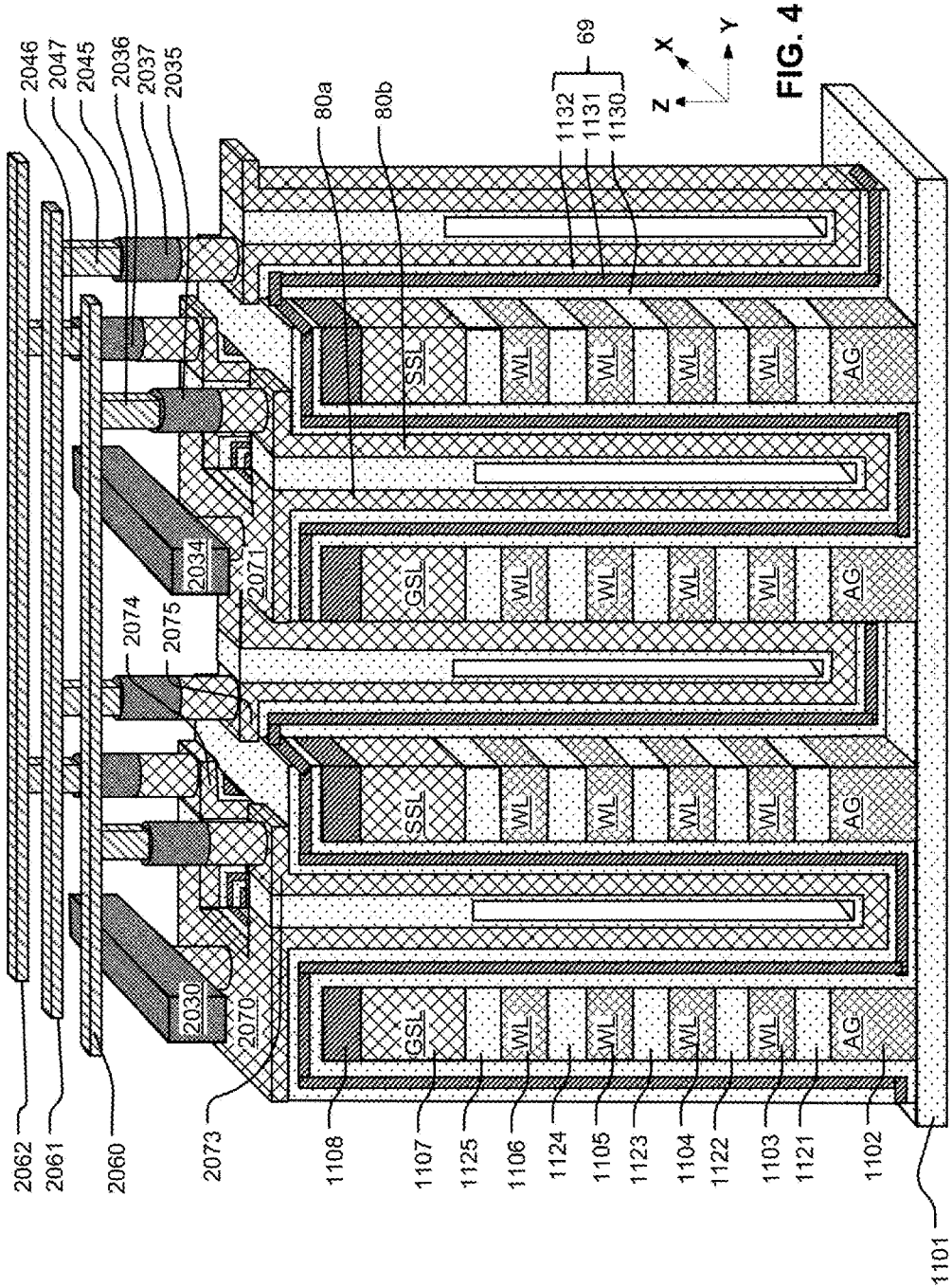
FIG. 4 illustrates a perspective view of a 3D memory block.

FIG. 4 is a perspective view of a 3D memory block implemented in a NAND memory device. The memory block comprises a plurality of stacks of conductive strips 1102, 1103, 1104, 1105, 1106 and 1107 alternating with insulating strips 1121, 1122, 1123, 1124, and 1125. Conductive strips 1103, 1104, 1105 and 1106 act as word lines (WLs) and conductive strip 1102 acts as an assist gate (AG). Conductive strips 1107 in even stacks act as gates for ground select line (GSL) transistors. Likewise, conductive strips 1107 in odd stacks act as gates for string select line (SSL) transistors. A pillar includes a vertical semiconductor/conductive film (e.g. 80a, 80b) and a first insulator 69 disposed between the adjacent stacks of conductive strips. First insulator 69 acts as a data storage structure comprising a blocking layer 1130, for example silicon oxide, a charge trapping layer 1131, for example silicon nitride, and a tunneling layer 1132, for example silicon oxide. A plurality of series-connected memory cells is located at cross-points between the pillars and conductive strips (WLs) 1103-1106.

Over the stacks are disposed a reference line structure and bit line structure. A reference line structure, such as the segment of the reference line 2031, 2034 in a first patterned conductive layer, can be arranged over the ground select line (GSL) in the even stacks of conductive strips and connected to the active pillar at the contact SL. A bit line structure, such as the segment of the bit line 2060, 2061, 2062 in a second patterned conductive layer, can be arranged orthogonally over the even and odd stacks of conductive strips and connected to the pillar, through the inter-level connector 2035, 2036, 2037 at the contact BL.

The conductive strips (e.g. 1102, 1103, 1104, 1105, 1106, and 1107) in different levels are connected separately, through staircase contact structures at landing pad areas (not shown), to corresponding metal lines disposed in a first patterned conductor layer overlying the plurality of stacks. So, the conductive strips in different levels in a same stack are not connected together.

FIG. 5 is a perspective view of a 3D capacitor according to the first embodiment. The 3D capacitor described herein comprises a plurality of stacks of conductive strips 1102, 1103, 1104, 1105, 1106 and 1107 alternating with insulating strips 1121, 1122, 1123, 1124, and 1125. The first terminal of the 3D capacitor is connected to conductive strips in consecutive levels in the stacks in a first set of every other stack in the plurality of stacks (e.g. even stacks), whereby the conductive strips in the first set of every other stack are conductively and passively connected together and act as a first plate of the 3D capacitor. The second terminal of the 3D capacitor is connected to conductive strips in consecutive levels in the stacks in a second set of every other stack in the plurality of stacks (e.g. odd stacks), whereby the conductive strips in the second set of every other stack are conductively and passively connected together and act as a second plate of the 3D capacitor. The first terminal is insulated from the second terminal. The stacks in the first set of every other stack are interdigitated with the stacks in the second set of every other stack. The second terminal is not connected to conductive strips in the first set of every other stack.

In this example, the conductive strips connected to the first terminal comprise all the conductive strips from the bottom-most level to the top-most level without any intervening conductive strip in-between connected to the second terminal. Likewise, the conductive strips connected to the second terminal comprise the conductive strips from the bottom-most level to the top-most level without any intervening conductive strip in-between connected to the first terminal. In another example, the conductive strips can comprise the conductive strips in the intermediate levels, for example from conductive strip 1103 to conductive strip 1106 or from conductive strip 1104 to conductive strip 1106 in consecutive levels, without any intervening conductive strip in-between. In yet another example, the conductive strips can comprise conductive strips in any levels, not in consecutive levels, in a same stack.

Figure 5A:
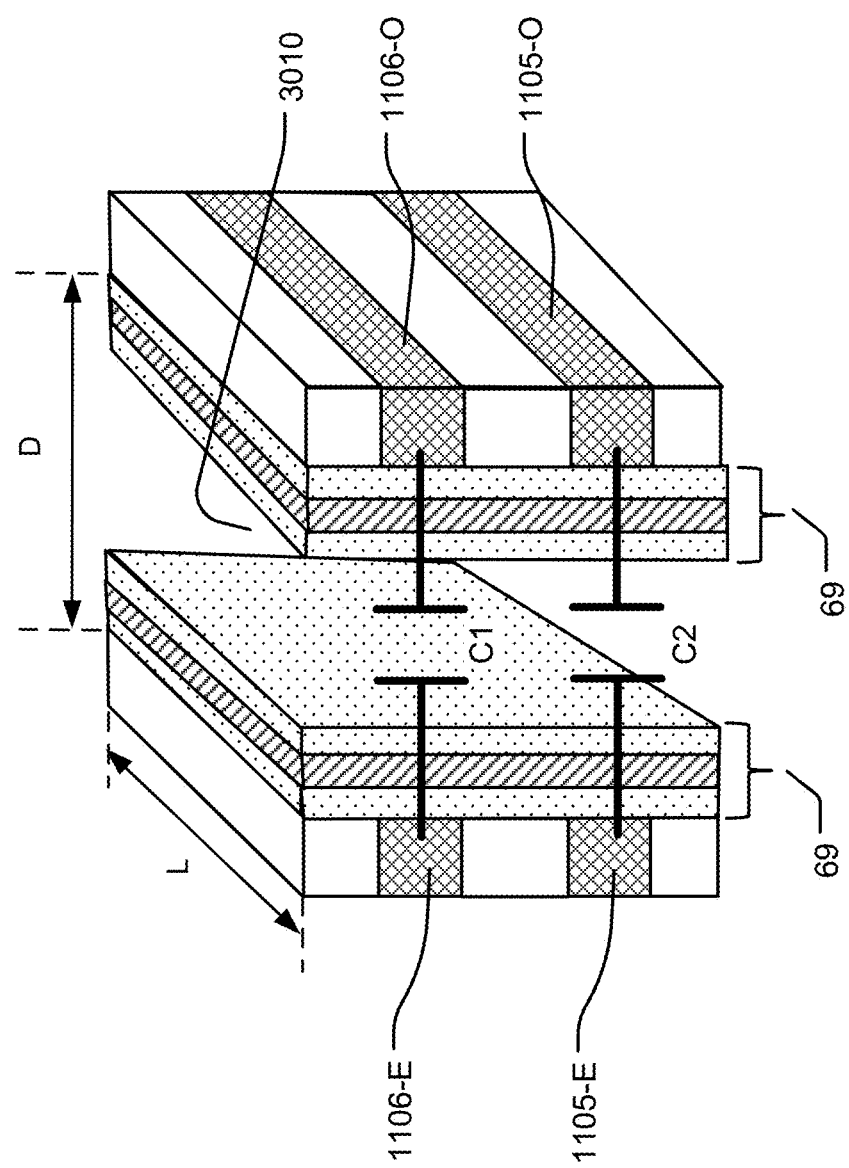

FIG. 5A illustrates a zoom-in view of the 3D capacitor of FIG. 5. In the illustration, first insulator 69 is formed on opposing sides between the right sides of conductive strips 1105-E, 1106-E and the left sides of conductive strips 1105-O, 1106-O. Second insulator 3010 is disposed between first insulator 69 on the opposing sides. Conductive strips 1105-E and 1106-E are connected to the first terminal of the 3D capacitor and act as the first plate of the 3D capacitor. No intervening conductive strips between conductive strips 1105-E and 1106-E are connected to the second terminal. Conductive strips 1105-O and 1106-O are connected to the second terminal of the 3D capacitor, and act as the second plate of the 3D capacitor. No intervening conductive strips between conductive strips 1105-O and 1106-O are connected to the first terminal. The dielectric of the 3D capacitor comprises first insulator 69 on opposing sides and second insulator 3010 in-between. Thus, capacitance C1 is formed between conductive strips 1106-E and 1106-O. Likewise, capacitance C2 is formed between conductive strips 1105-E and 1105-O. Assuming the total thickness of the conductive strips is H μm, the length of the conductive strips is L μm, the distance between the first and second plates is D, and the number of the units is N, then the overall capacitance can be approximated by $C = \in_0 \times \in \times H \times L \times N/D$, where $\in_0$ is the dielectric constant in vacuum and $\in$ is the dielectric constant of first and second insulators.

Figure 6:
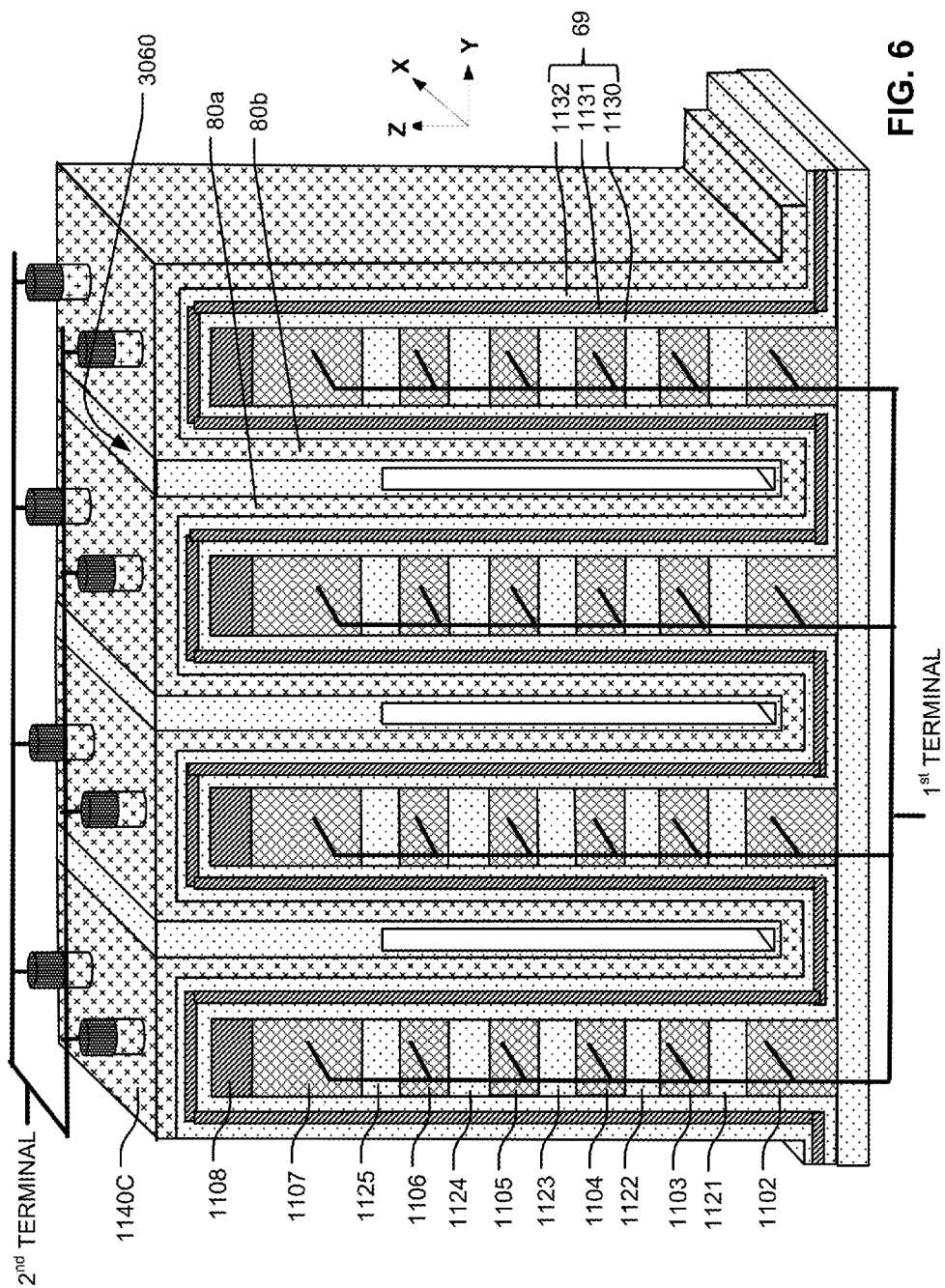
FIGS. 6-6A illustrate perspective views of a 3D capacitor according to the second embodiment.

FIG. 6 is a perspective view of a 3D capacitor according to the second embodiment. Reference numerals used in FIG. 5 are generally applied in the following Figures and not described again. The capacitor of FIG. 6 differs from the capacitor of FIG. 5 in that a first terminal of the 3D capacitor is connected to conductive strips in each stack in one or more stacks and the second terminal of the 3D capacitor is connected to a plurality of pillars on sides of the stack in the one or more stacks. In the illustration, the 3D capacitor comprises a plurality of stacks of conductive strips alternating with insulating strips and the plurality of pillars respectively includes a vertical conductive film (e.g. 80a, 80b) and a first insulator 69. A conductive film 1140C overlies first insulator 69 on the top and sides of the stacks in the plurality of stacks. The conductive strips in the plurality of stacks are conductively and passively connected together to a first terminal of the 3D capacitor and act as a first plate of the 3D capacitor. The first terminal is insulated from the second terminal. The vertical conductive films (e.g. 80a, 80b) in the plurality of pillars between adjacent stacks are conductively and passively connected together and act as a second plate of the 3D capacitor. First insulator 69 acts as the dielectric of the 3D capacitor. Within a pillar between the adjacent stacks is disposed a fill structure 3060, in which a seam may be formed.

In this example, the conductive strips in consecutive levels in the plurality of stacks connected to the first terminal comprise the conductive strips from the bottom-most level to the top-most level without any intervening conductive strip in-between connected to the second terminal. In another example, the conductive strips connected to the first terminal can comprise the conductive strips in the intermediate levels, for example from conductive strip 1103 to conductive strip 1106, without any intervening conductive strip in-between connected to the second terminal. In yet another example, the conductive strips connected to the first terminal can comprise the conductive strips in any levels, not in consecutive levels, in a same stack.

Figure 6A:
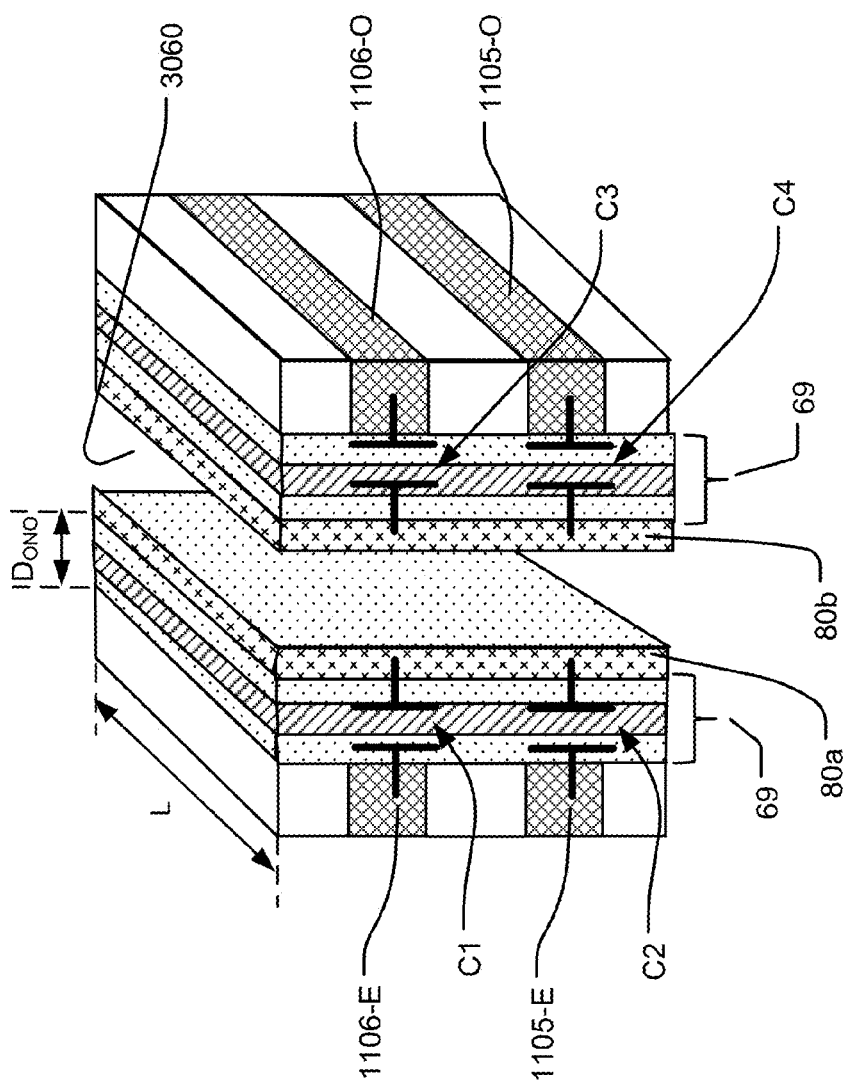

FIG. 6A illustrates a zoom-in view of the 3D capacitor of FIG. 6. In the illustration, first insulator 69 is formed on opposing sides between right sides of conductive strips 1105-E, 1106-E and left sides of conductive strips 1105-O, 1106-O. Vertical conductive film (e.g. 80a, 80b) overlies first insulator 69 formed on opposing sides between the adjacent stacks. Fill structure 3060 is disposed between vertical conductive films (e.g. 80a, 80b) on the opposing sides of the stacks in the plurality of stacks. Conductive strips 1105-E, 1106-E, 1105-O, and 1106-O are conductively and passively connected to the first terminal of the 3D capacitor and act as the first plate of the 3D capacitor. No intervening conductive strips are disposed between conductive strips 1105-E and 1106-E, and between conductive strips 1105-O and 1106-O. Vertical conductive films 80a and 80b are conductively and passively connected to the second terminal of the 3D capacitor and act as the second plate of the 3D capacitor. First insulator acts as the dielectric of the 3D capacitor. Capacitances C1-C4 are thus formed between vertical conductive films 80a, 80b and conductive strips 1106-E, 1105-E, 1106-O and 1106-O, respectively. Assuming the total thickness of the conductive strips is H μm, the length of the conductive strips is L μm, the distance between the first and second plates is $D_{ONO}$, and the number of the units is N, the overall capacitance can be approximated by $C = \in_0 \times \in \times 2(H \times L) \times N/D_{ONO}$, where $\in_0$ is the dielectric constant in vacuum and c is the dielectric constant of the first insulator (ONO). The capacitor of FIG. 6 includes at least two-fold capacitance compared with the capacitor of FIG. 5.

Figure 7:
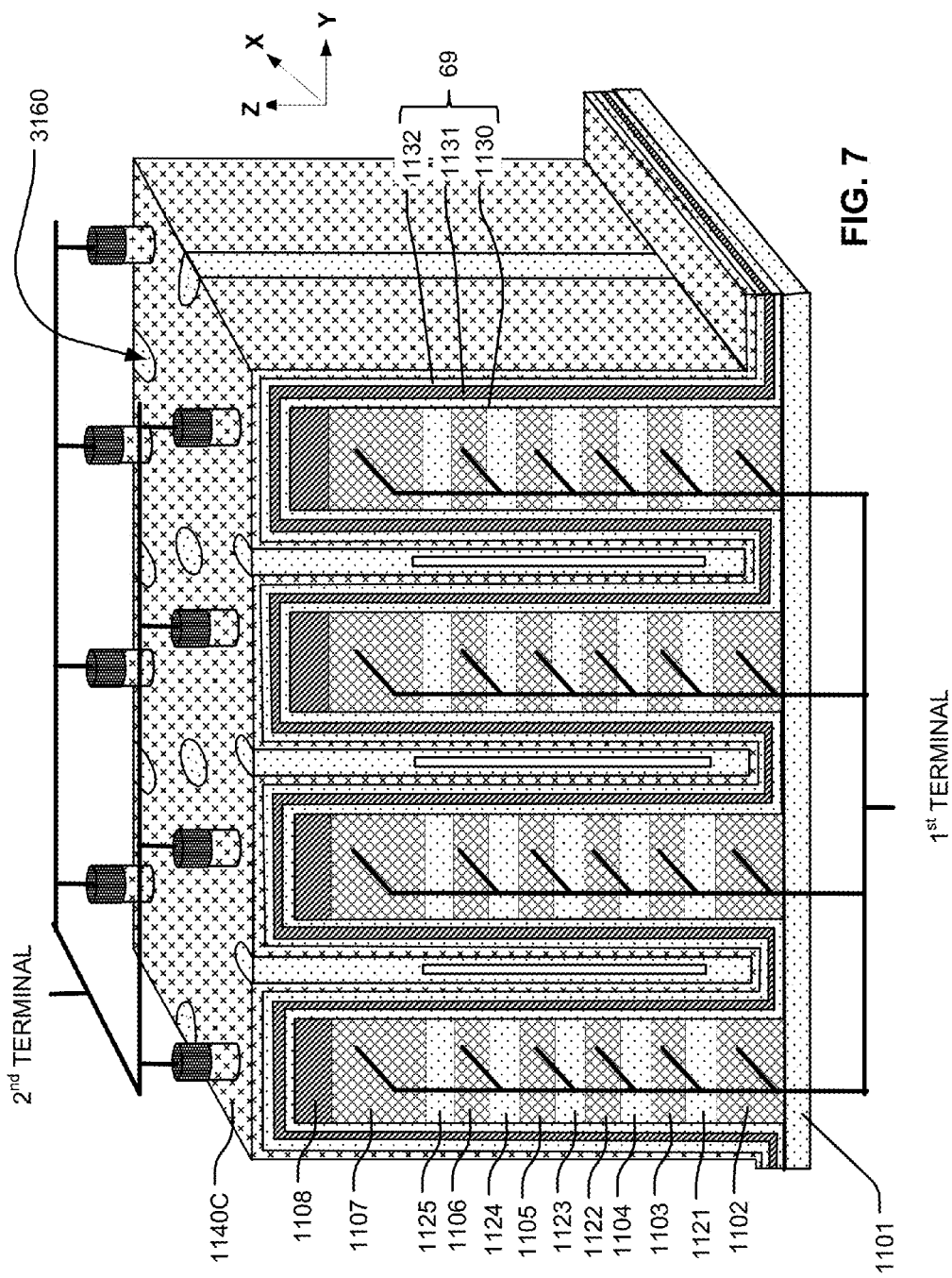
FIGS. 7-7A illustrate perspective views of a 3D capacitor according to the third embodiment.

FIG. 7 is a perspective view of a 3D capacitor according to the third embodiment. The capacitor of FIG. 7 differs from the capacitor of FIG. 6 in that the plurality of pillars is disposed through the conductive strips and the plurality of pillars has a twisted or honeycomb arrangement. The 3D capacitor described comprises one or more stacks of conductive strips alternating with insulating strips and a plurality of pillars respectively including a vertical conductive film and a first insulator 69. The first terminal of the 3D capacitor is connected to conductive strips in the one or more stacks, whereby the conductive strips are conductively and passively connected together and act as the first plate of the 3D capacitor. The second terminal of the 3D capacitor is connected to the vertical conductive films in the plurality of pillars, whereby the vertical conductive films are conductively and passively connected together and act as the second plate of the 3D capacitor. The first terminal is insulated from the second terminal. A fill structure 3160 is disposed within each of the plurality of pillars.

The number and location of the pillars may be implemented dependent, and may be different from those illustrated in FIGS. 6 and 7. For the sake of simplicity, only one stack in the plurality of stacks is illustrated in FIG. 7.

In this example, the conductive strips in consecutive levels in the one or more stacks connected to the first terminal comprise the conductive strips from the bottom-most level to the top-most level without any intervening conductive strip in-between connected to the second terminal. In another example, the conductive strips connected to the first terminal can comprise the conductive strips in the intermediate levels, for example from conductive strip 1103 to conductive strip 1106, without any intervening conductive strip in-between connected to the second terminal. In yet another example, the conductive strips connected to the first terminal can comprise the conductive strip in any levels, not in consecutive levels, in a same stack.

Figure 7A:
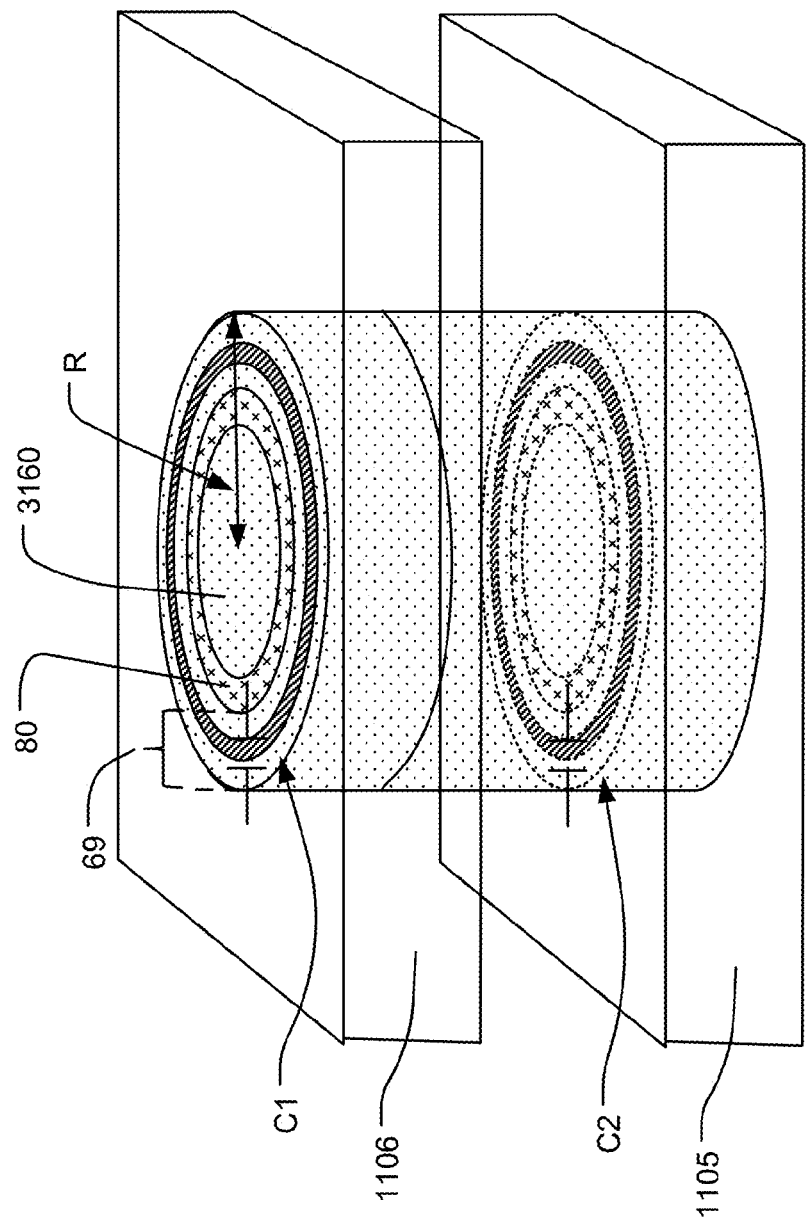

FIG. 7A illustrates a zoom-in view of the 3D capacitor of FIG. 7. In this example, the cross-section of the pillar is a circular shape with a radius R. Conductive strips 1105, 1106 are conductively and passively connected together to the first terminal of the 3D capacitor and act as the first plate of the 3D capacitor. No intervening conductive strips between conductive strips 1105, 1106 are connected to the first terminal. Vertical conductive films 80 are conductively and passively connected to the second terminal of the 3D capacitor and act as the second plate of the 3D capacitor. First insulator acts as the dielectric of the 3D capacitor. Capacitance C1 is thus formed between conductive strip 1106 and vertical conductive film 80. Likewise, capacitance C2 is formed between conductive strip 1105 and conductive film 80. Assuming the total thickness of the conductive strips is H µm, the radius of the circular pillar is R µm, and the number of the pillars is N, the overall capacitance can be approximated by $C = \in_0 \times \in \times (H \times 2\pi R) \times N$, where $\in_0$ is the dielectric constant in vacuum and $\in$ is the dielectric constant of the first insulator (ONO). In another example, the pillar can be other shape, such as square and oval, and the pillars can have other arrangement.

Figure 8:
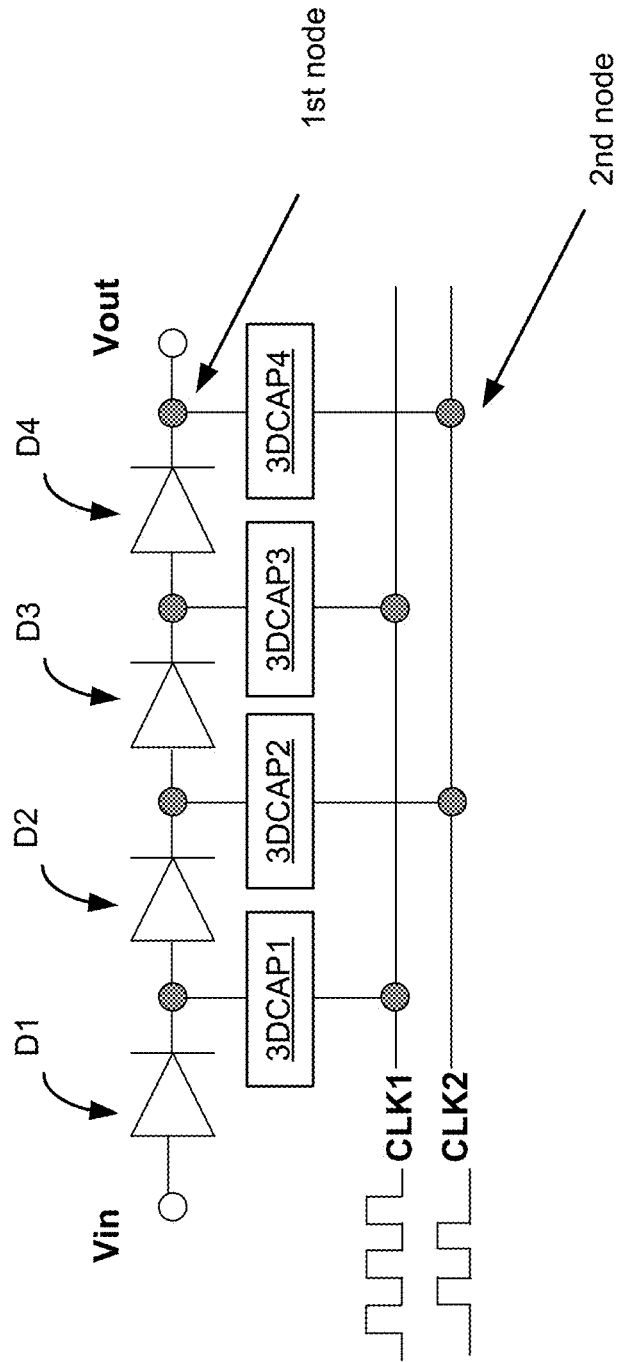
FIG. 8 is a simplified charge pump schematic diagram using the 3D capacitors described herein.

FIG. 8 illustrates a simplified charge pump schematic diagram using the 3D capacitors as described herein. The four-stage charge pump, in this example, includes four 3D capacitors 3DCAP1, 3DCAP2, 3DCAP3, and 3DCAP4. In another example, the charge pump can employ one 3D capacitor and place it at the output end so as to provide the boosted voltage. As illustrated, the first terminal of the 3D capacitor is connected to the first node of the charge pump, and the second terminal of the 3D capacitor is connected to the second node of the charge.

A. 3D Memory Blocks

FIGS. 9 through 17 illustrate an example process flow of manufacturing a 3D memory block.

Figure 9:
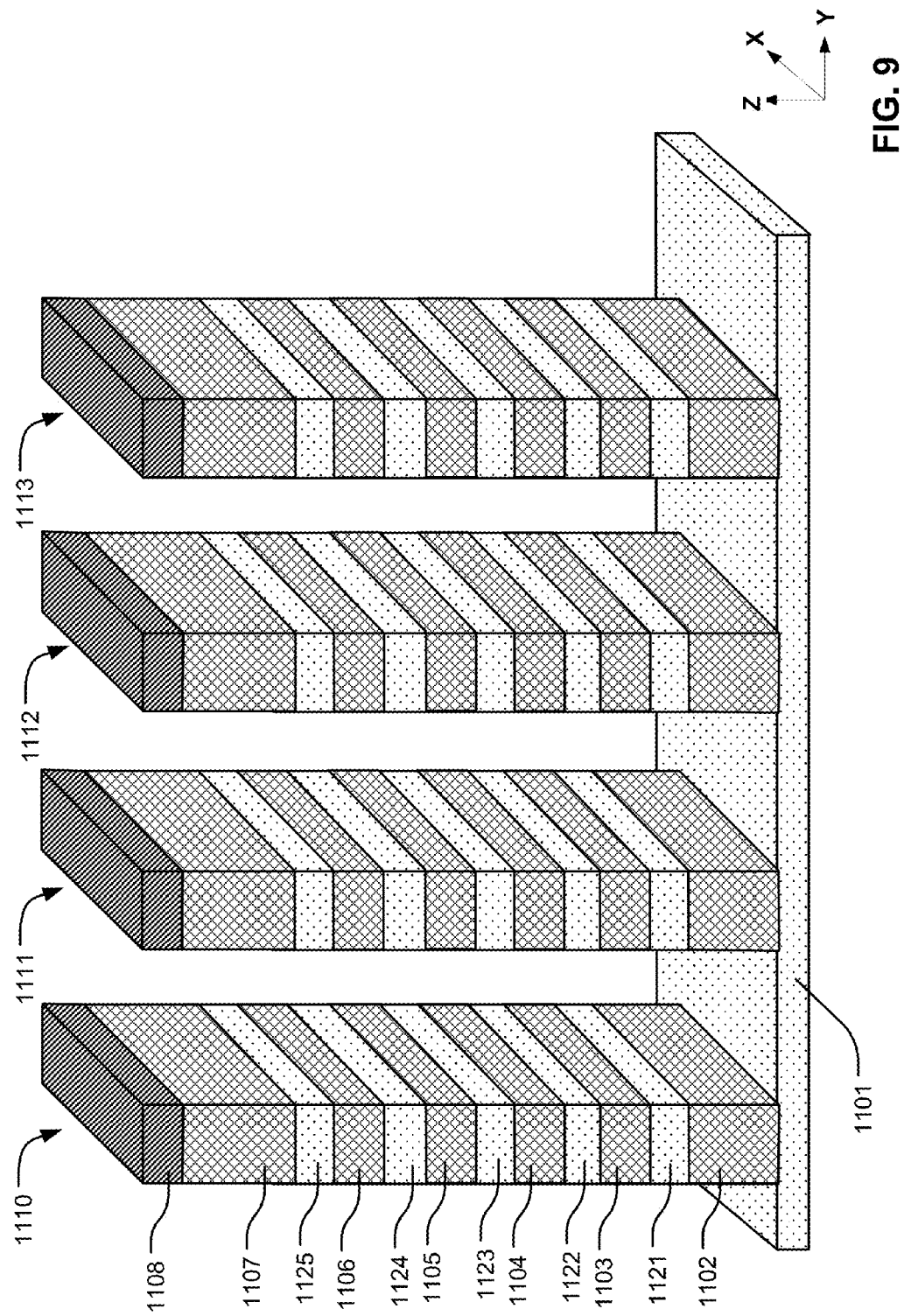
FIGS. 9-17 are perspective views illustrating structures during manufacturing stages for a 3D memory block.

FIG. 9 illustrates a stage of the process flow after etching a plurality of layers, and stopping at insulating layer 1101, to define stacks. To form the structure shown in FIG. 9, a plurality of conductive layers alternating with insulating layers is deposited over an insulating layer 1101 on a substrate (now shown). After the plurality of layers is formed, a patterned etch is applied to form a plurality of stacks 1110, 1111, 1112 and 1113 of conductive strips 1102, 1103, 1104, 1105, 1106, and 1107 alternating with insulating strips 1121, 1122, 1123, 1124, 1125, and 1108.

Conductive layers can be formed using the same conductive material of polysilicon or epitaxial single crystal silicon, with lightly n-type or p-type doping. A layer of silicon nitride, the top-most layer, which can be used to provide tensile stress, is deposited over the plurality of layers in this example. This layer can improve the uniformity of the stacks and reduce bending, when they are etched with high aspect ratios and narrow lines. The layers of insulating material can comprise silicon oxide deposited in a variety of ways as known in the art. Also, the layers of insulating material can comprise other insulating materials, and combinations of insulating materials. In this example, all of the insulating layers, with the exception of top layer, consist of the same material, such as silicon oxide. In other examples, different materials can be used in different layers as suits a particular design goal.

In yet another example, conductive strip 1102 acting as assist gates can be implemented using a doped region in the substrate beneath the active pillars, or using other techniques.

The plurality of stacks includes at least a bottom level of conductive strip acting as assist gates (AG), a plurality of intermediate levels of conductive strips acting as word lines (WLs), and a top level of conductive strip acting as gates for SSL/GLS transistors. The plurality of intermediate levels can include N levels, ranging from 0 to N−1 for the stack.

Figure 10:
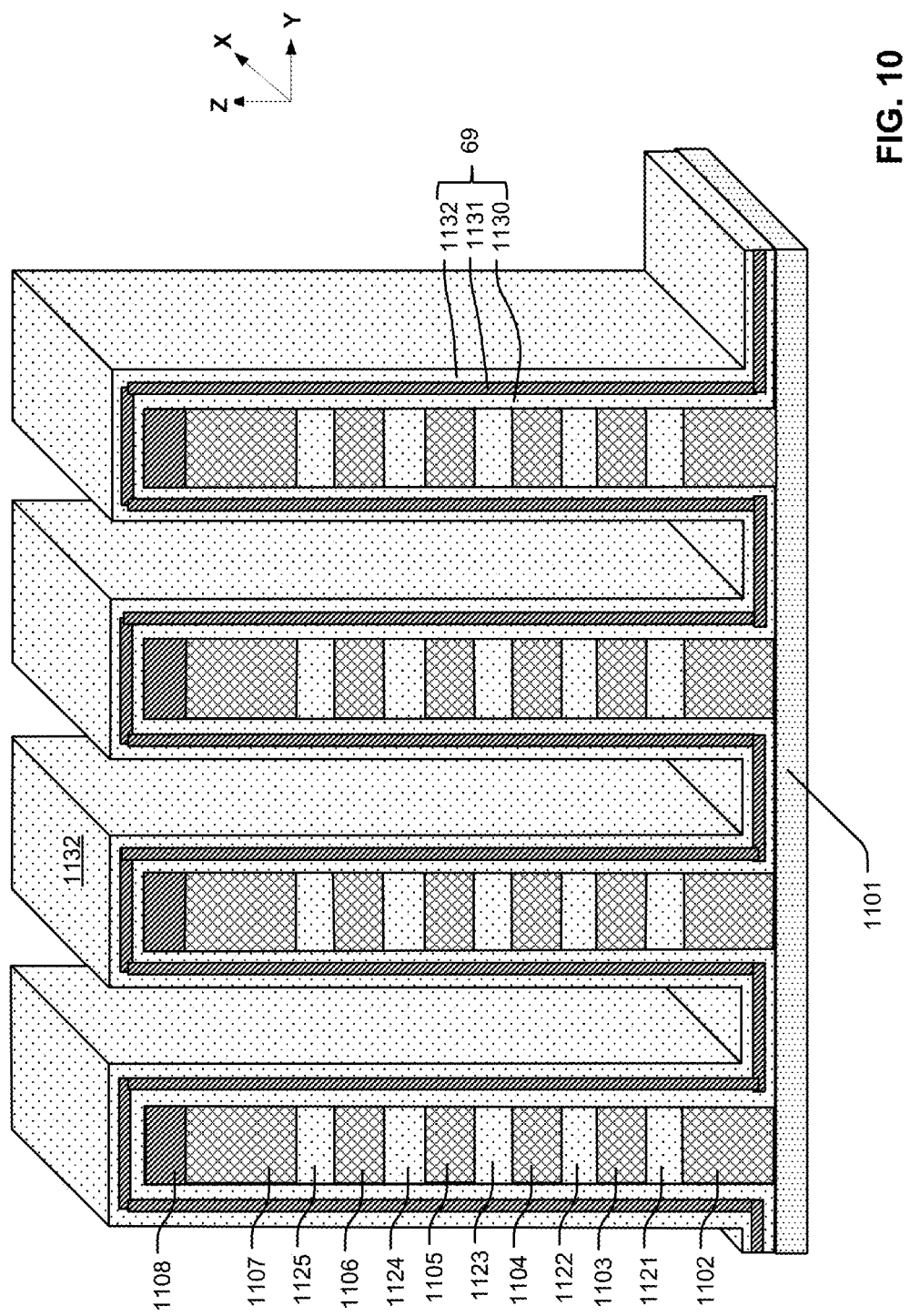

FIG. 10 illustrates a stage of the process flow after forming a first insulator 69 over and on the top and sides of the plurality of stacks so that first insulator 69 contacts sidewalls of conductive strips in the plurality of stacks. First insulator 69 acts as data storage structures of the memory blocks, comprising a funneling layer 1132, a charge trapping layer 1131, and a blocking layer 1130.

A tunneling layer 1132 may comprise silicon oxide of a thickness about 20 Å to 60 Å, for example, about 40 Å formed using LPCVD. Other tunneling materials and structures may be employed, for example, composite tunneling structure. The composite tunneling structure comprises a layer of silicon dioxide less than 2 nm thick, a layer of silicon nitride less than 3 nm thick, and a layer of silicon dioxide less than 4 nm thick. In one embodiment, the composite tunneling structure consists of an ultrathin silicon oxide layer $O_1$ (e.g. ≤15 Å), an ultrathin silicon nitride layer $N_1$ (e.g. ≤30 Å) and an ultrathin silicon oxide layer $O_2$ (e.g. ≤35 Å), which results in an increase in the valence band energy level of about 2.6 eV at an offset 15 Å or less from the interface with the semiconductor body. The $O_2$ layer separates the $N_1$ layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the $O_2$ layer does not significantly interfere with the electric field assisted hole tunneling, while improving the ability of the engineered tunneling dielectric to block leakage during low fields. These layers can be conformally deposited using, for example, low-pressure chemical vapor deposition (LPCVD).

A charge trapping layer 1131 may comprise silicon nitride of thickness about 40 Å to 90 Å, for example, about 70 Å formed using LPCVD. Other charge trapping materials and structures may be employed, including, for example, silicon oxynitride ($Si_xO_yN_z$), silicon-rich nitride, silicon-rich oxide, trapping layers including embedded nano-particles and so on.

A blocking layer 1130 may comprise silicon oxide of a thickness of about 50 Å to 130 Å, for example, about 90 Å formed by LPCVD or other wet conversion from the nitride by a wet furnace oxidation process. Other blocking dielectrics can include high-κ materials like aluminum oxide of 150 Å.

The deposition techniques applied to form the multilayer data storage structure can be carried out by conventional LPCVD processes. On the other hand, atomic layer deposition (ALD) or other suitable tools can be utilized for these films. The gate dielectric layer in the regions of the SSL and GSL layers can have a different composition than the data storage structure.

The data storage structure described above can be known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

Figure 11:
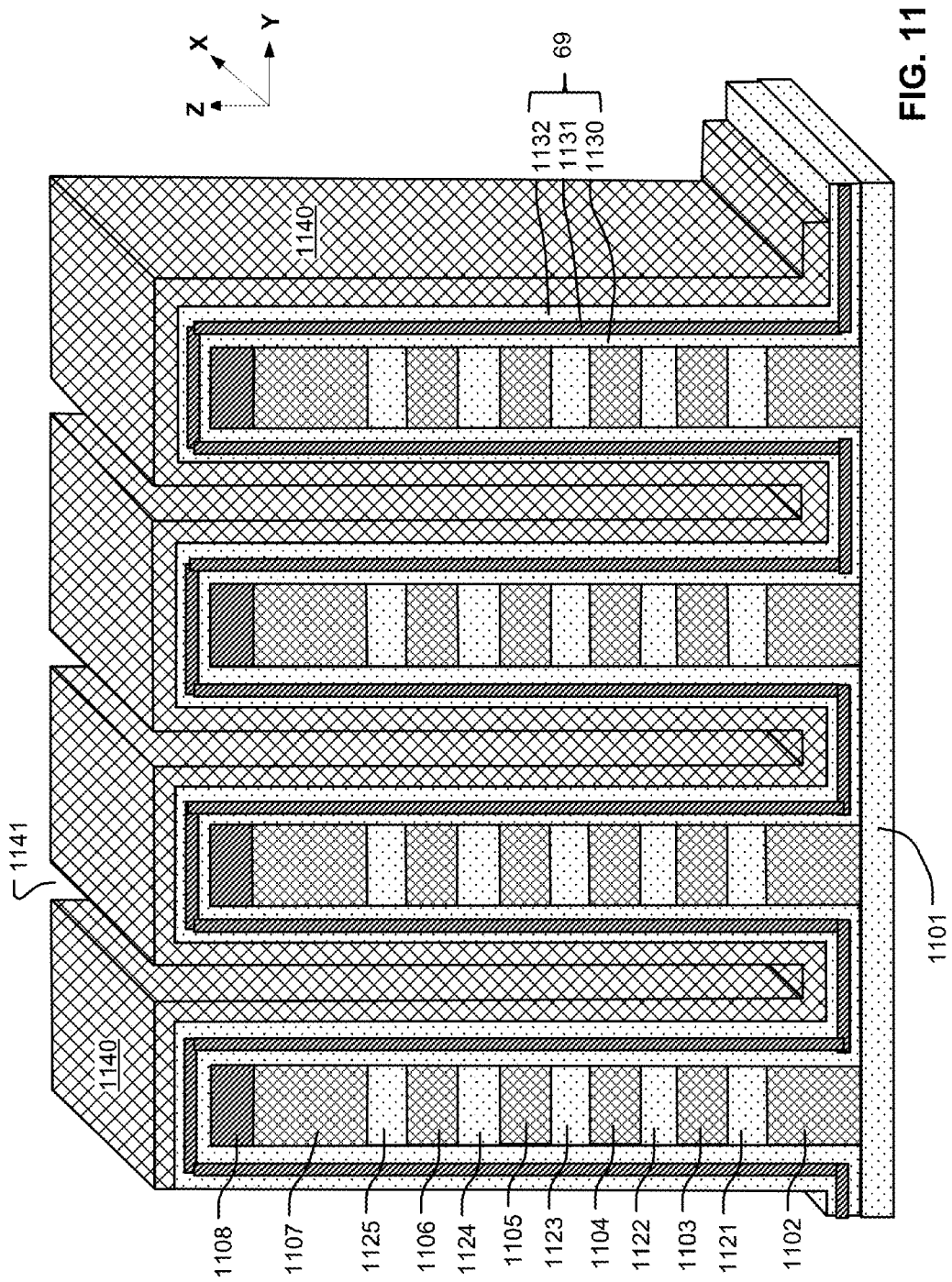

FIG. 11 illustrates a stage of the process flow after forming a semiconductor film 1140 over, and having a surface conformal with, first insulator 69 on the plurality of stacks. Semiconductor film 1140 can have a thickness of about 10 nanometers or less. As illustrated, in the regions (e.g. 1141) between the stacks, semiconductor film 1140 extends to the bottom of the regions (e.g. 1141) between the stacks, and overlies first insulator 69. A thin layer of oxide (not shown) can be formed by a short oxidation of semiconductor film 1140. Semiconductor film 1140 comprises a semiconductor adapted by choice of material, e.g. silicon, and doping concentrations, e.g. undoped or lightly doped. In the memory blocks, semiconductor film 1140 acts as channel regions of memory cells, at least in the regions between the adjacent stacks in the plurality of stacks.

Figure 12:
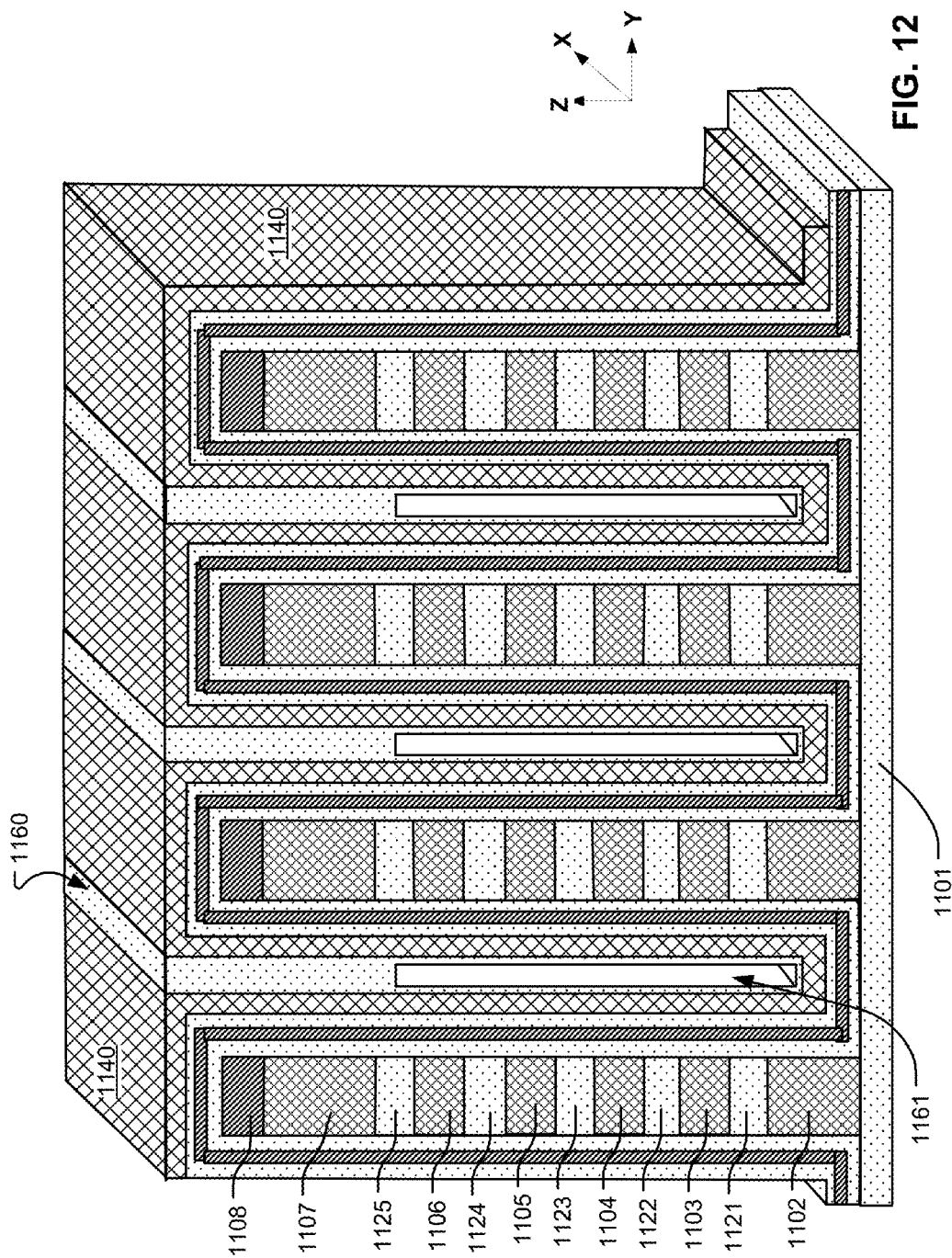

FIG. 12 illustrates a stage in the process flow after performing a step to fill the regions (e.g. 1141 of FIG. 10) between stacks on the inside surface of semiconductor film 1140 with an insulating material. The overhangs may be formed on the top of the inside surface of semiconductor film 1140 when the fill step is applied. Seams or voids 1161 may be formed when two adjacent overhangs are very close or connected together such that the regions between the stacks cannot be completely filled by the insulating material. After the fill step, an etch back or planarizing step such as chemical mechanical polishing can be applied to expose the top surface of semiconductor film 1140. In the illustrated example, fill structure 1160 includes seams (e.g. 1161) in the regions adjacent the conductive strips at the intermediate and bottom levels, and includes filled portions in the regions adjacent the conductive strips at the top level. The seam 1161 encloses gas, such as gas from the atmosphere in the chamber during formation, which can be called "air" for the purposes of this description.

In another example, the insulating material can completely fill the regions so that the fill structure 1160 is filled with a solid insulator, such as silicon oxide, low-κ dielectric materials or other suitable insulators between the stacks.

In yet another example, the seams may extend to the top of the regions between the stacks.

The fill structure 1160 including either seams or solid insulators can reduce capacitive coupling between the opposing sidewalls of semiconductor film 1140 in the active pillars.

Figure 13:
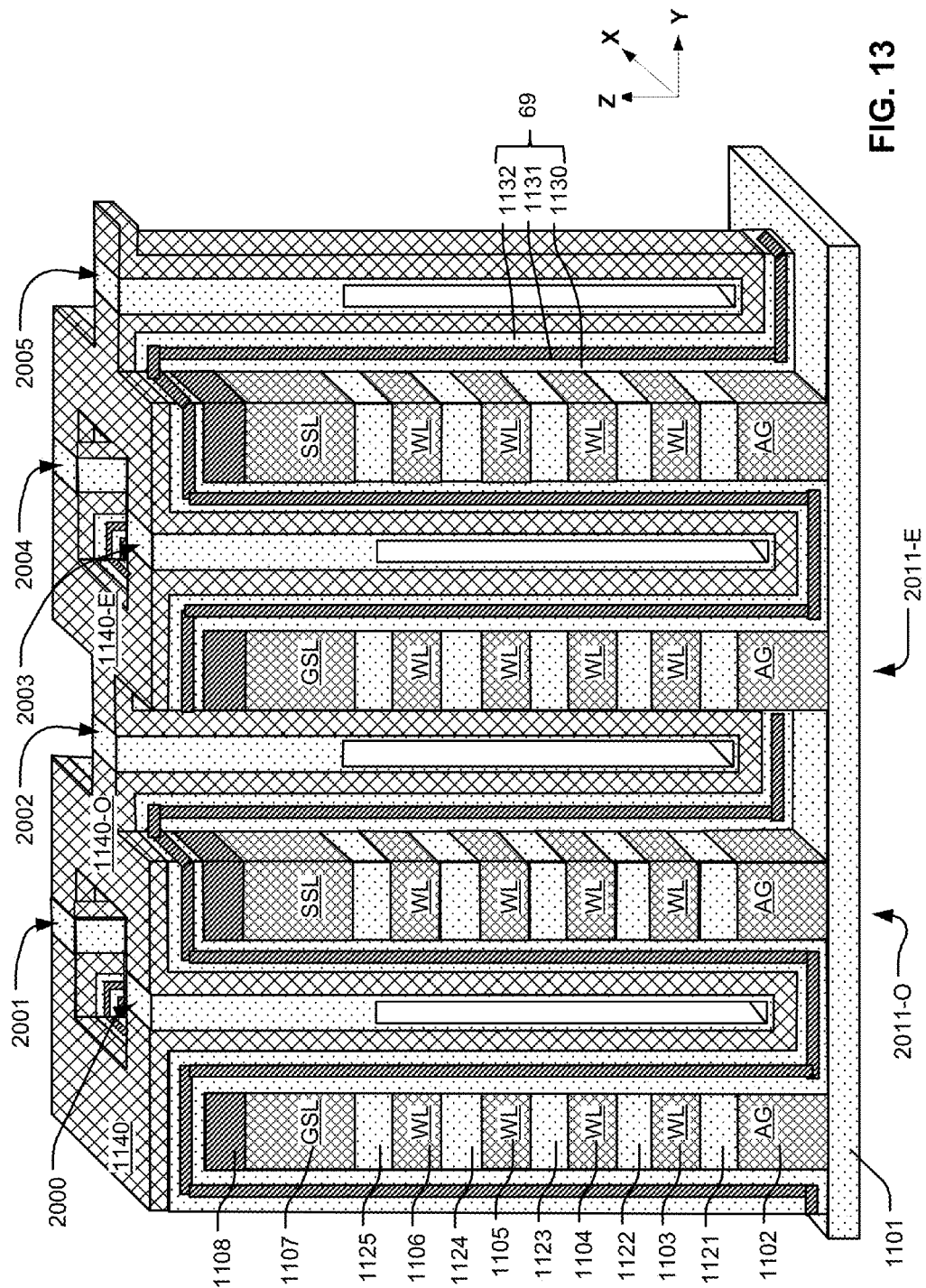

FIG. 13 illustrates a stage in the process flow after applying a pillar cut etch which includes etching holes between the stacks in the plurality of stacks to form a plurality of insulating structures 2000, 2001, 2002, 2003, 2004, and 2005. In this example, the holes extend to expose insulating layer 1101. As a result of the pillar cut etch, the vertical channel structures are formed, which are disposed between the even stacks (e.g. 2011-E) and odd stacks (e.g. 2011-O). Insulating structure 2002 is disposed between stack 2011-E and stack 2011-O in this example. The vertical channel structures comprise even and odd vertical semiconductor films having outside surfaces and inside surfaces. The outside surfaces are disposed on and contact the data storage structures on the sidewalls of the even and odd stacks forming 3D array of memory cells. The inside surfaces are alternating with an insulating structure (e.g. 2000, 2001, 2002, 2003, 2004, and 2005), which in this example includes an insulating material and a seam. The vertical semiconductor film of the vertical channel structures can have thicknesses of 10 nm or less.

As illustrated in FIG. 12, the vertical channel structures are laid out in a honeycomb arrangement, so that each row of vertical channel structures is offset in the row direction from adjacent rows. This honeycomb arrangement facilitates formation of overlying bit lines with a tighter pitch. Insulating fill (not shown) is applied in the holes between the vertical channel structures.

After the pillar cut etch, semiconductor film 1140 is continuous over the top of the stacks and connected to the vertical semiconductor films, acting as vertical channel structures, of the pillars. In FIG. 13, portion 1140-O of semiconductor film 1140 overlies odd stack 2011-O and is continuous along the top of stack 2011-O. Portion 1140-O of semiconductor film 1140 connects the vertical channel structures on the left side of insulating structure 2002, the vertical channel structures on the right side of insulating structure 2000 and the vertical channel structures on the right side of insulating structure 2001. Portion 1140-E of semiconductor film 1140 overlies even stack 2011-E and is continuous along the top of stack 2011-E. Portion 1140-E of semiconductor film 1140 connects the vertical channel structures on the right side of insulating structure 2002, the vertical channel structures on the left side of insulating structure 2003 and the vertical channel structures on the left side of insulating structure 2004 in this illustration.

Figure 14:
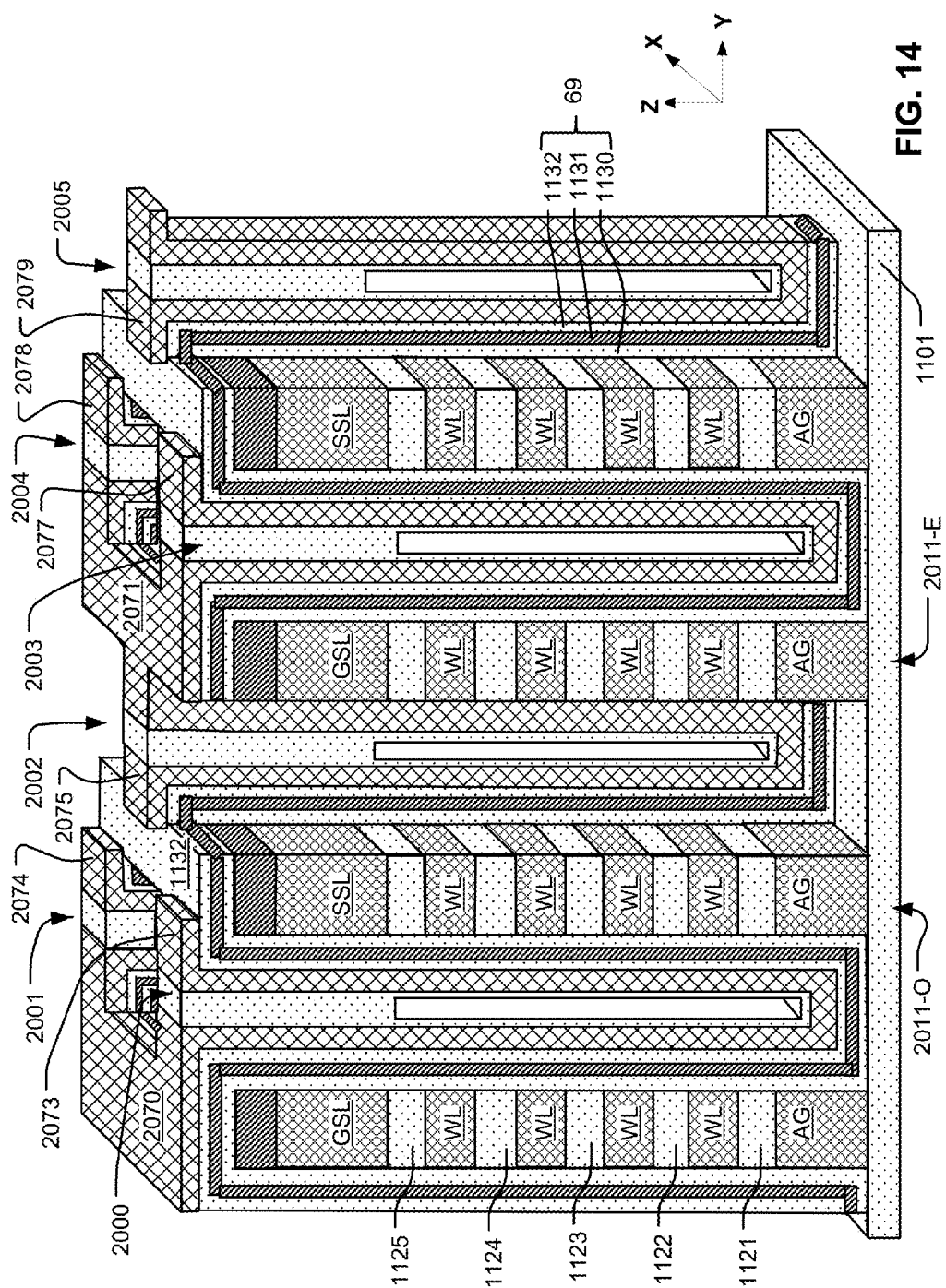

FIG. 14 illustrates a stage in the process flow after doing a patterned etch to the divide semiconductor film 1140 remaining on the top of the stacks in the plurality for the purposes of forming array connections. After the patterned etch, semiconductor film 1140 is divided into portions 2070 and 2071 which overlie the even stacks, and portions 2073, 2074, 2075, 2077, 2078 and 2079 which overlie the odd stacks. Portions 2070 and 2071 connect the pillars on the common source sides of the NAND strings together and provide landing areas for interlayer connectors for connection to a common source line. Portions 2073, 2074, 2075, 2077, 2078 and 2079 are separated and provide landing areas for interlayer connectors making independent connection to bit lines.

Figure 15:
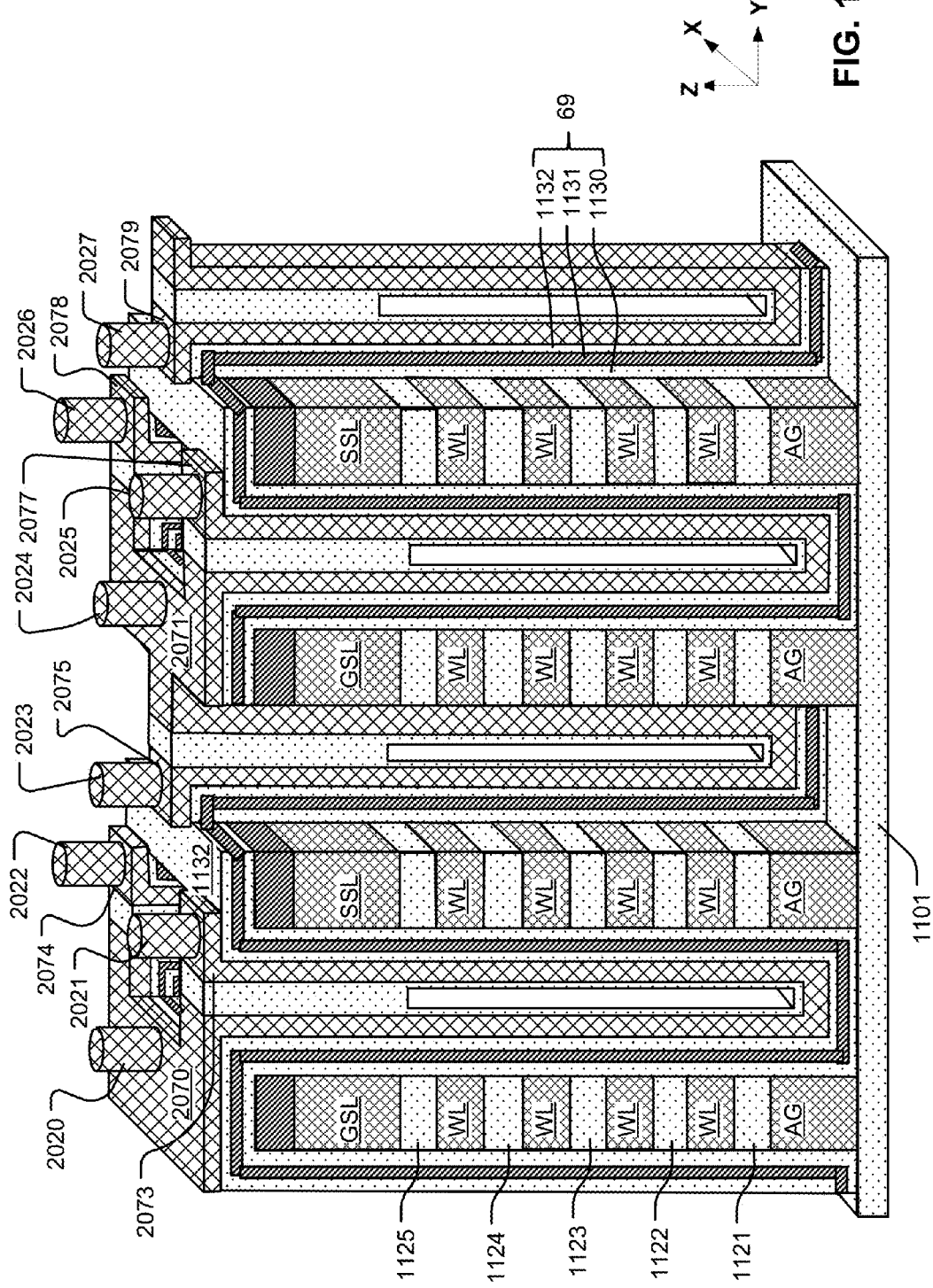

FIG. 15 illustrates the structure of a following stage after formation of an array of interlayer connectors 2020, 2021, 2022, 2023, 2024, 2025, 2026, 2027 through an interlayer dielectric (not shown), landing on corresponding portions 2073, 2074, 2075, 2077, 2078 and 2079. The process can include formation of a layer of interlayer dielectric such as silicon oxide on top of the array, which can be for example about 100 nm to 500 nm thick, followed by formation of openings through the interlayer dielectric exposing the landing areas on the portions 2073, 2074, 2075, 2077, 2078 and 2079. A conductive material compatible with the semiconductor film is deposited to fill the openings, thereby forming the interlayer connectors. The interlayer connector can comprise a polysilicon plug. Interlayer connectors 2020 and 2024 provide for electrical connection to portions 2070 and 2071 which are continuous with vertical channel structures on the GSL sides of pillars. Interlayer connectors 2021, 2022, 2023, 2025, 2026, and 2027 provide for electrical connection to portions 2073, 2074, 2075, 2077, 2078, and 2079, respectively, which are portions on the SSL side of the pillars.

Figure 16:
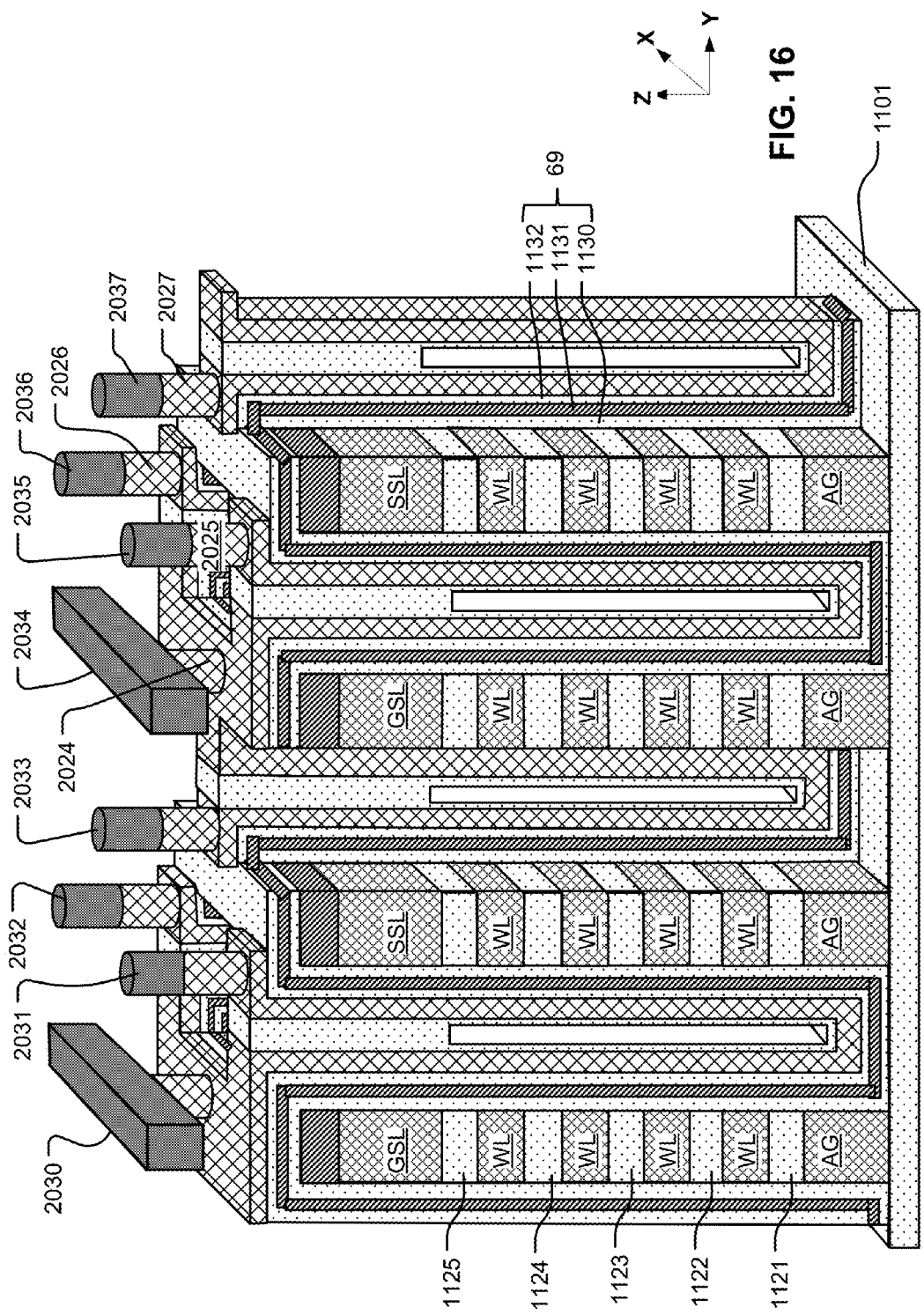

FIG. 16 illustrates the structure after formation of a first patterned conductor layer including reference lines (e.g. 2030, 2034) and inter-level connectors (e.g. 2031, 2032, 2033, 2035, 2036, and 2037). Reference line 2034 makes electrical contact with interlayer connector 2024 and other interlayer connectors (not shown) disposed over the same stack and is connected to the vertical channel structures on the GSL sides of NAND strings. As such, reference line 2034 acts as a local common source line and provides connection to a global common source line.

The reference line described herein can be a segment of a reference line, and the segment of the reference line and the inter-level connector are formed in a metal layer first deposited during manufacturing.

Inter-level connectors 2035, 2036 and 2037 are aligned over and make electrical contact with interlayer connectors 2025, 2026 and 2027, respectively, in this example. The inter-level connectors are connected to the vertical channel films on the SSL sides of NAND strings and provide independent connection to the bit lines.

The reference lines and the inter-level connectors can comprise tungsten or other conductive materials such as copper, cobalt silicide, tungsten silicide, other metal materials or combinations thereof, and are formed in the same level.

Figure 17:
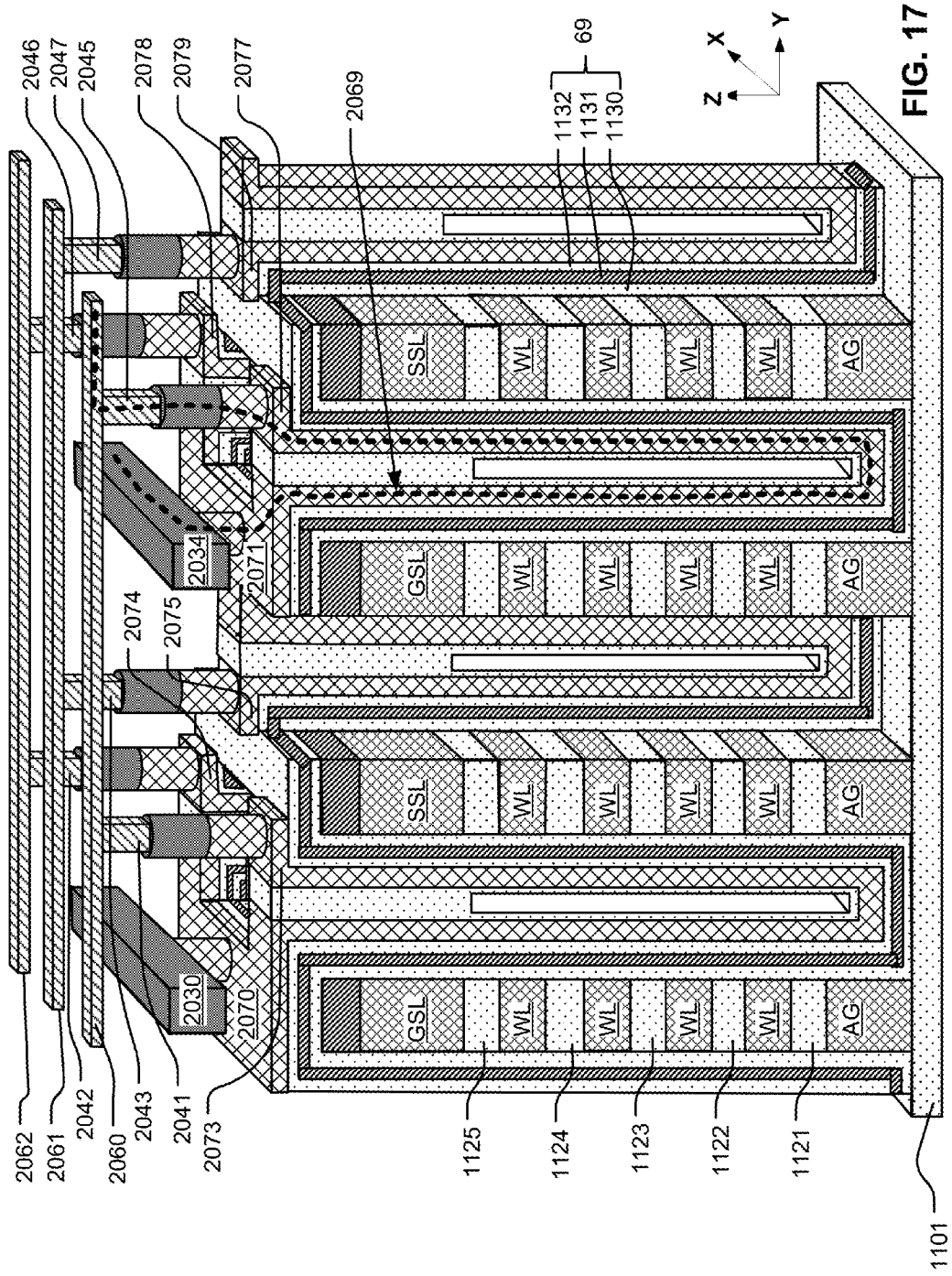

FIG. 17 illustrates the structure after applying a second patterned conductor layer over the first patterned conductor layer. The second patterned conductor layer comprises a plurality of bit lines (e.g. 2060, 2061 and 2062), and each bit line in the plurality has at least an extension. The extension is formed in the process of bit line formation and extends downward. The bit line described herein can be a segment of a bit line. For example, bit line 2060 includes extensions 2041 and 2045; bit line 2061 includes extensions 2043 and 2047; and bit line 2062 includes extensions 2042 and 2046. The extension can comprise a fin. The second patterned conductor layer is formed by means of a dual damascene process. As illustrated in FIG. 17, portion 2070 of the semiconductor film including the vertical semiconductor films on the GSL sides of NAND strings in the pillars is connected by the interlayer connector (e.g. 2020 of FIG. 15) to reference line 2030 in the first patterned conductor level. Likewise, portion 2071 of the semiconductor film including the vertical semiconductor films on the GSL sides of NAND strings in the pillars is connected by the interlayer connector (e.g. 2024 of FIG. 15) to reference line 2034 in the first patterned conductor level. Reference lines 2030 and 2034 connect the plurality of the interlayer connectors along the respective rows and can be operated as common source line. Portions 2073 and 2077 of the semiconductor film including the vertical semiconductor films structures on SSL sides of NAND strings in the pillars are connected through the inter-level connectors to extensions 2041, 2045 of bit line 2060. Portions 2075 and 2079 of the semiconductor film including the vertical semiconductor films on SSL sides of NAND strings in the pillars are connected through the inter-level connectors to extensions 2043, 2047 of bit line 2061. Portions 2074 and 2078 of the semiconductor film including the vertical semiconductor films structures on SSL sides of NAND strings in the pillars are connected through the inter-level connectors to extensions 2042, 2046 of bit line 2062. In this example, the memory block is a three dimensional vertical channel (3GVC) structure as described in U.S. patent application Ser. No. 14/861,377, entitled REFERENCE LINE AND BIT LINE STRUCTURE FOR 3D MEMORY, by Yeh et al., which application is incorporated by reference as if fully set forth herein.

In another example, the memory block can be implemented a three dimensional vertical gate (3DVG) structure as described in U.S. Pat. No. 8,208,279 B2, entitled INTEGRATED CIRCUIT SELF ALIGNED 3D MEMORY ARRAY AND MANUFACTURING METHOD, by H. T. Lue, which application is incorporated by reference as if fully set forth herein. In the 3DVG memory array, the conductive strips in the plurality of stacks include bit lines, and the vertical conductive films include word lines.

A circuit path 2069 is shown in FIG. 17 illustrating the current flow for a U-shaped NAND string which is connected between reference line 2034 and bit line 2060. The structure shows a plurality of pillars between the stacks of conductive strips. Each of the plurality of pillars comprises a vertical semiconductor film having outside surfaces and inside surfaces. The outside surfaces are disposed on tunneling layer 1132 of first insulator 69 on the sidewalls of the adjacent stacks in the plurality of stacks. The memory cells are series-connected to form a current path from an upper end to a lower end of the vertical semiconductor film on the GSL side, and from a lower end to an upper end of the vertical semiconductor film on the SSL side.

B. 3D Capacitor of the First Embodiment

Most process steps of manufacturing the 3D memory block are applicable to manufacturing the 3D capacitor of the first embodiment so that many deposition and etch steps are shared and carried out in the memory blocks and also in the capacitor regions. Therefore, to avoid repetition, only the differences will be described. The 3D capacitor of the first embodiment can be formed using the process flow as described above with reference to FIGS. 9-12, and followed by the process flow as described below with reference to FIGS. 18-21.

Figure 18:
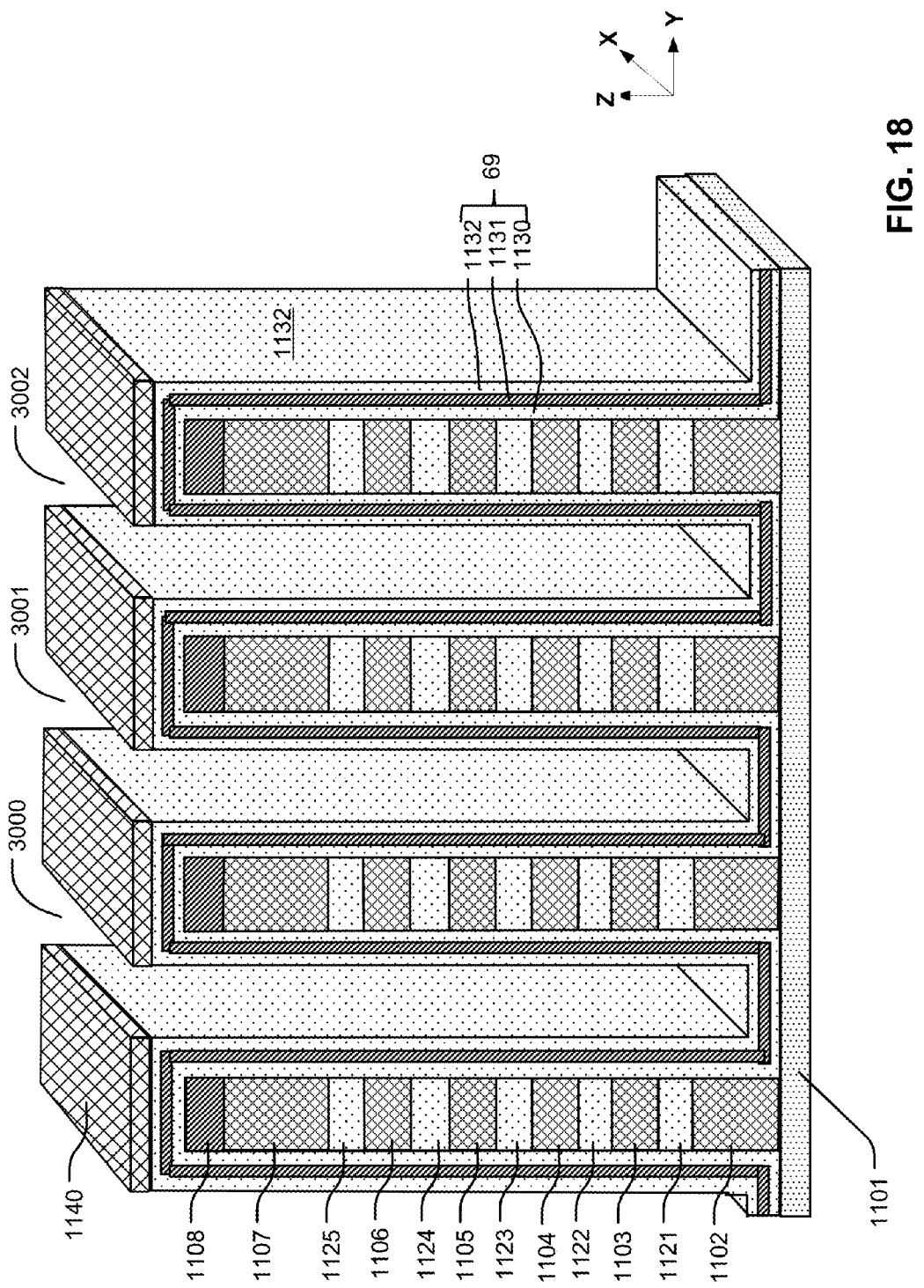
FIGS. 18-21 are perspective views illustrating additional structures during manufacturing stages for a 3D capacitor in the first embodiment accompanying the process for the 3D memory block.

FIG. 18 illustrates a stage in the process flow after applying trench etch to the structure of FIG. 12 to remove the fill structure (e.g. 1160 of FIG. 12) and remove vertical semiconductor film between the stacks in the plurality. As illustrated, the trench etch stops at tunneling layer 1132 to form trenches 3000, 3001, and 3002 between the stacks. In this example, first insulator 69 on the sidewalls of the stacks in the plurality is not etched away and the remaining semiconductor film 1140 is only on the top of the stacks in the plurality. In another example, the trench etch can remove the vertical semiconductor film and the vertical first insulator on the sidewalls of the stacks, leaving them only on the top of the stacks.

Figure 19:
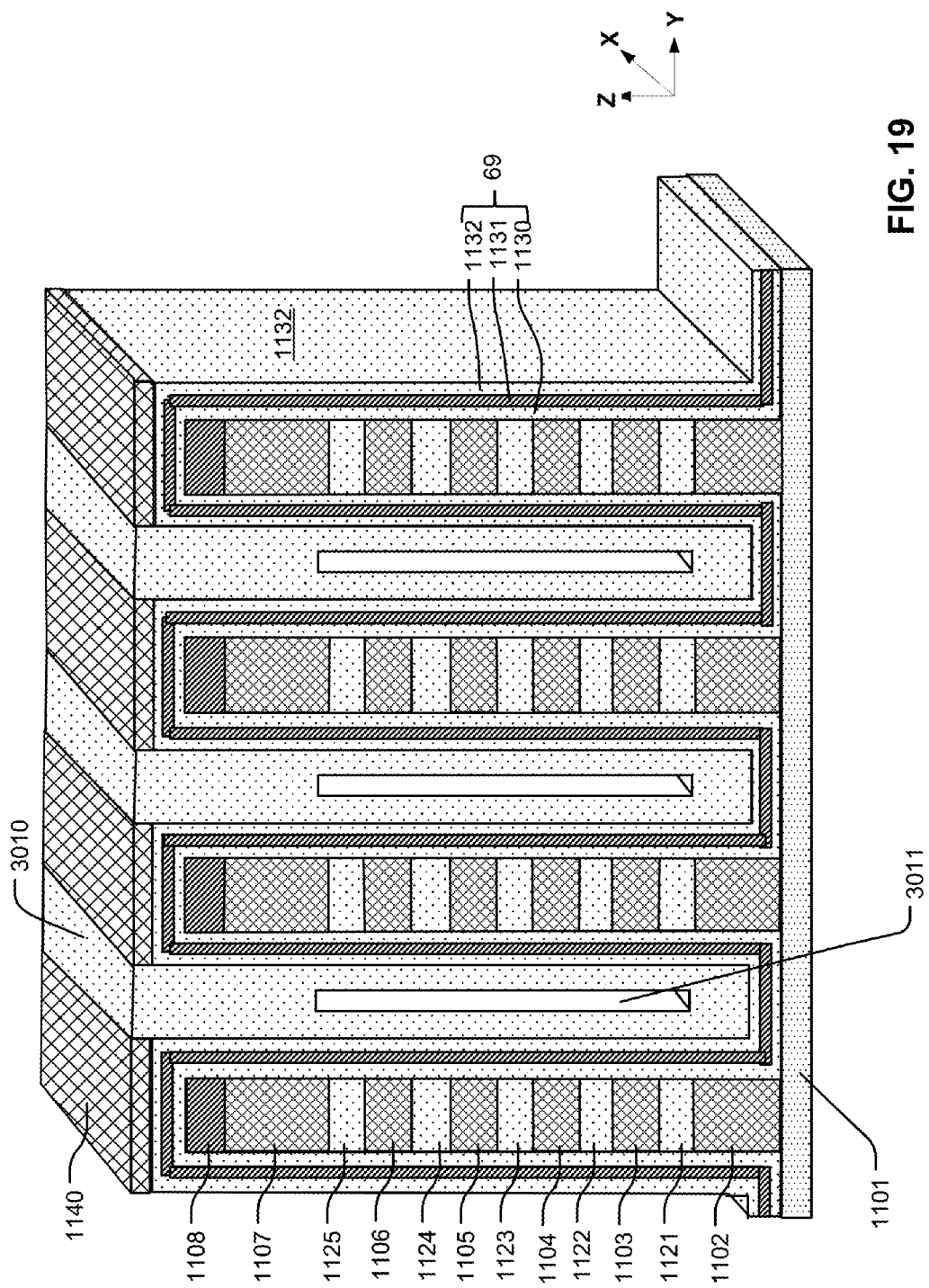

FIG. 19 illustrates a stage in the process flow after performing a step to fill the trenches (e.g. 3000, 3001, and 3002 of FIG. 18) between stacks on the inside surfaces of tunneling layer 1132 with an insulating material. The overhangs may be formed on the top of the inside surface of second silicon oxide layer 1132 when the fill step is applied. Seams or voids 3011 may be formed when two adjacent overhangs are very close or connected together such that the trenches between the stacks cannot be completely filled by the insulating material. After the fill step, an etch back or planarizing step such as chemical mechanical polishing can be applied to expose the top surface of semiconductor film 1140. In the illustrated example, second insulator 3010 includes seams 3011 adjacent the conductive strips at the intermediate and bottom levels, and includes filled portions adjacent the conductive strips at the top level. The seam 3011 encloses gas, such as gas from the atmosphere in the chamber during formation, which can be called "air" for the purposes of this description.

In another example, the insulating material can completely fill the trenches so that second insulator 3010 is filled with a solid insulator, such as silicon oxide, low-κ dielectric materials or other suitable insulators between the stacks.

In yet another example, the seams may extend to the top of the regions between the stacks.

Figure 20:
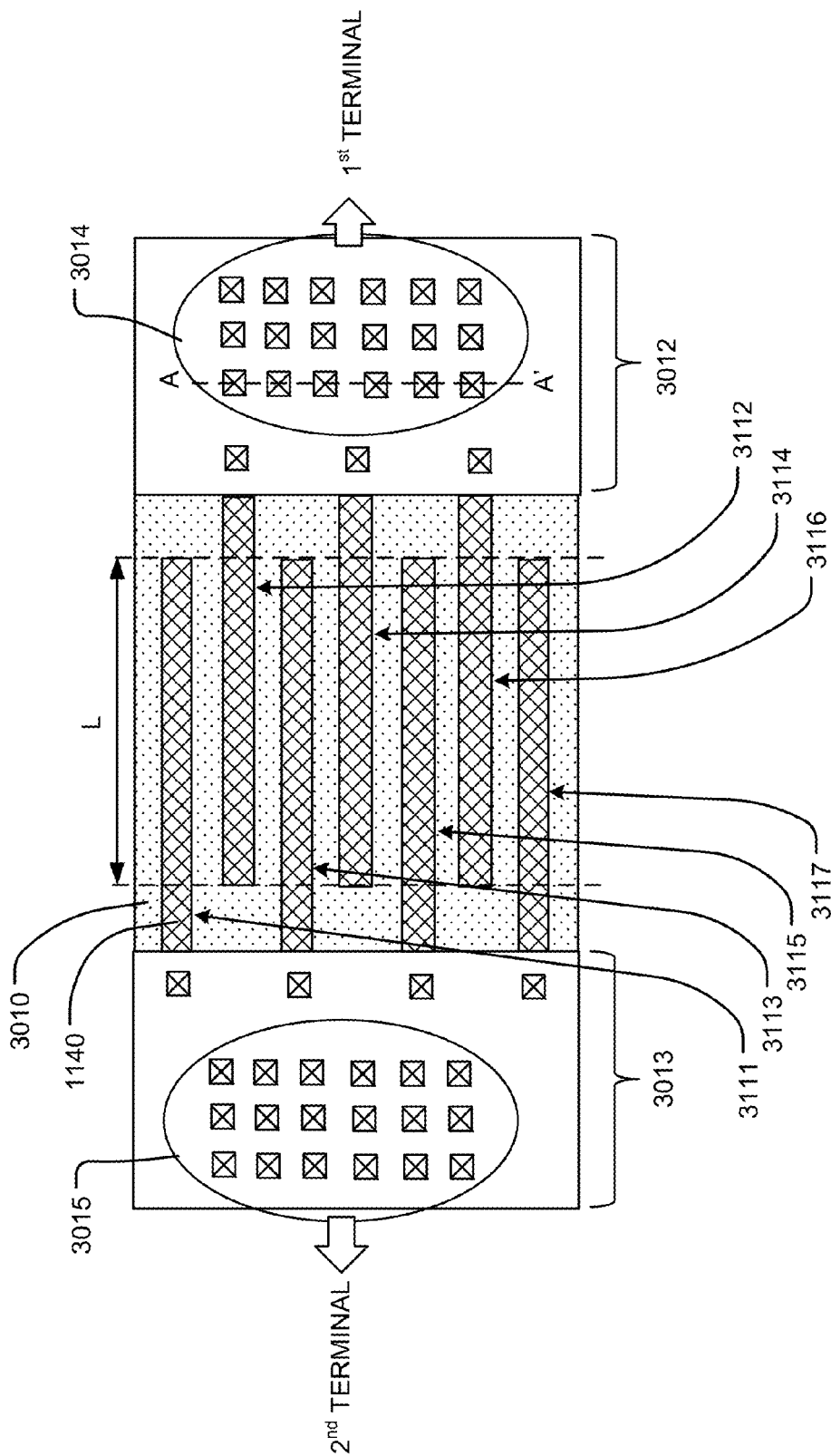

FIG. 20 illustrates a top view of the structure of FIG. 19. In the illustration, odd stacks 3111, 3113, 3115, and 3117 extend from the left side landing pad area 3013, and even stacks 3112, 3114 and 3116 extend from the right side landing pad area 3012. Semiconductor film 1140 is on the top of the plurality of stacks, not on the landing pad areas 3012 and 3013. Odd stacks 3111, 3113, 3115, and 3117 are interdigitated with and separated from even stacks 3112, 3114 and 3116 by second insulator 3010. As illustrated, the first terminal is connected to the conductive strips in consecutive levels in the stacks in a first set of every other stacks, for example even stacks 3112, 3114 and 3116, and the second terminal is connected to the conductive strips in consecutive levels in the stacks in a second set of every other stacks, for example odd stacks 3111, 3113, 3115, and 3117. The conductive strips in the even stacks act as the first plate of the 3D capacitor, the conductive strips in the odd stacks act as the second plate of the 3D capacitor, and the combination of first insulator and second insulator act as the dielectric of the 3D capacitor in this example.

Right side landing pad area 3012 comprises a right side contact region 3014 including a plurality of contact plugs connected to corresponding conductive strips. Likewise, left side landing pad area 3013 comprises a left side contact region 3015 including a plurality of contact connected to corresponding conductive strips.

Figure 21:
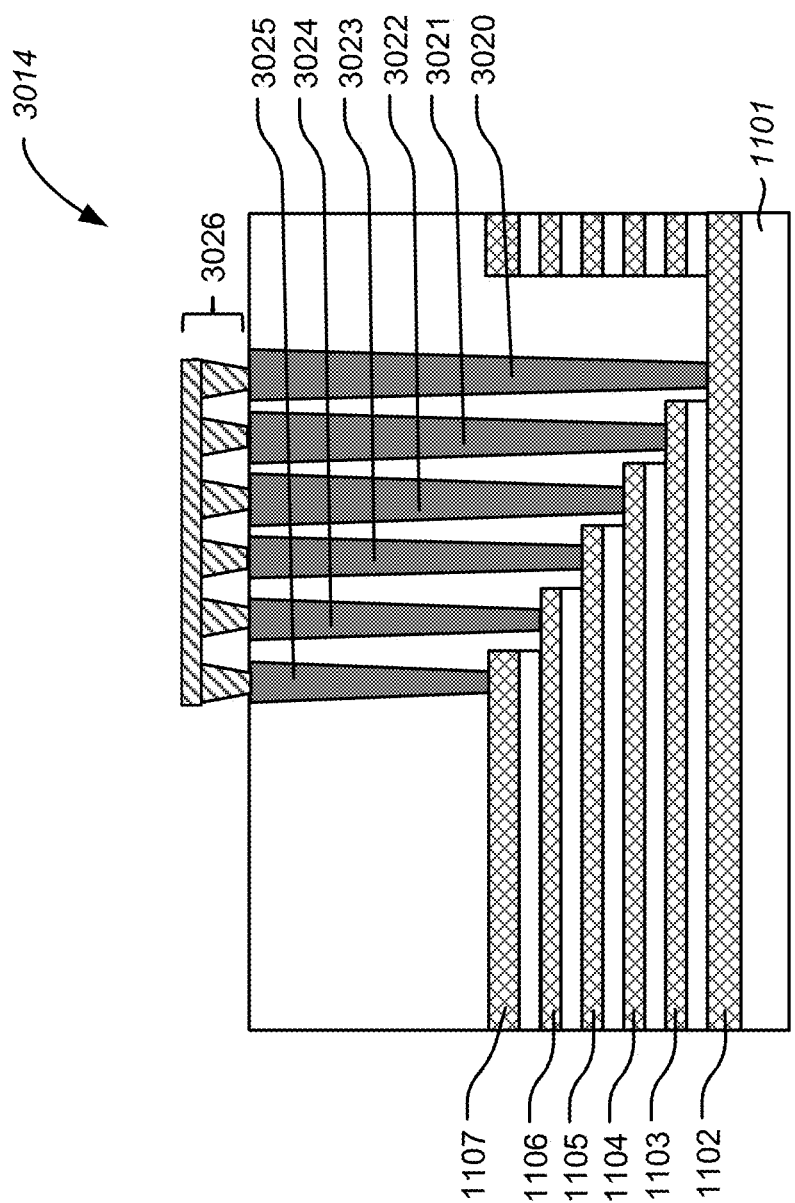

FIG. 21 is a simplified cross-section along line AA' of the right side contact region 3014 of FIG. 20. In the illustration, contact plugs 3020, 3021, 3022, 3023, 3024, and 3025 respectively lands on the strips 1102, 1103, 1104, 1105, 1106, and 1107, respectively, so as to be arranged in a staircase structure. An intermediate connector 3026 can be disposed in the first patterned conductor layer and contacts each of the plurality of contact plugs 3020, 3021, 3022, 3023, 3024, and 3025 so that conductive strips 1102, 1103, 1104, 1105, 1106, and 1107 in the stacks extending from the right side landing pad area, i.e. even stacks, are conductively and passively connected together to intermediate connector 3026 disposed in the first patterned conductor layer. Intermediate connector 3026 is connected to the first terminal of the 3D capacitor, i.e. to the first node of a charge pump (as shown in FIG. 8). As such, the conductive strips in the even stacks (e.g. 3012, 3014, and 3016 of FIG. 20) are conductively and passively connected together, through intermediate connector 3026 and contact plugs 3020, 3021, 3022, 3023, 3024, and 3025, to the first terminal of the 3D capacitor describe herein.

Likewise, left side contact region (3015 of FIG. 20) includes a plurality of contact plugs respectively landing on corresponding conductive strips arranged in a staircase structure, as illustrated in FIG. 21. A second intermediate connector (not shown) contacts each of the plurality of contact plugs so that conductive strips in the stacks extending from the left side landing pad area, i.e. odd stacks, are conductively and passively connected together to the second intermediate connector. The second intermediate connector can be disposed in a second patterned conductor layer so that the first intermediate connector does not have electrical contact with the second intermediate connector. The second intermediate connector is connected to the second terminal of the 3D capacitor, i.e. to the second node of a charge pump (as shown in FIG. 8). As such, the conductive strips in the odd stacks (e.g. 3011, 3013, 3015, and 3017 of FIG. 20) are conductively and passively connected together, through the second intermediate connector and contact plugs, to the second terminal of the 3D capacitor describe herein.

C. 3D Capacitors of the Second Embodiment

Most process steps of manufacturing the 3D memory array are applicable to manufacturing the 3D capacitor of the second embodiment, so that many deposition and etch steps are shared and carried out in the memory blocks and also in the capacitor regions. Therefore, to avoid repetition, only the differences will be described. The 3D capacitor of the second embodiment can be formed using the process flow as described above with reference to FIGS. 9-10, and followed by the process flow as described below with reference to FIGS. 22-25.

Figure 22:
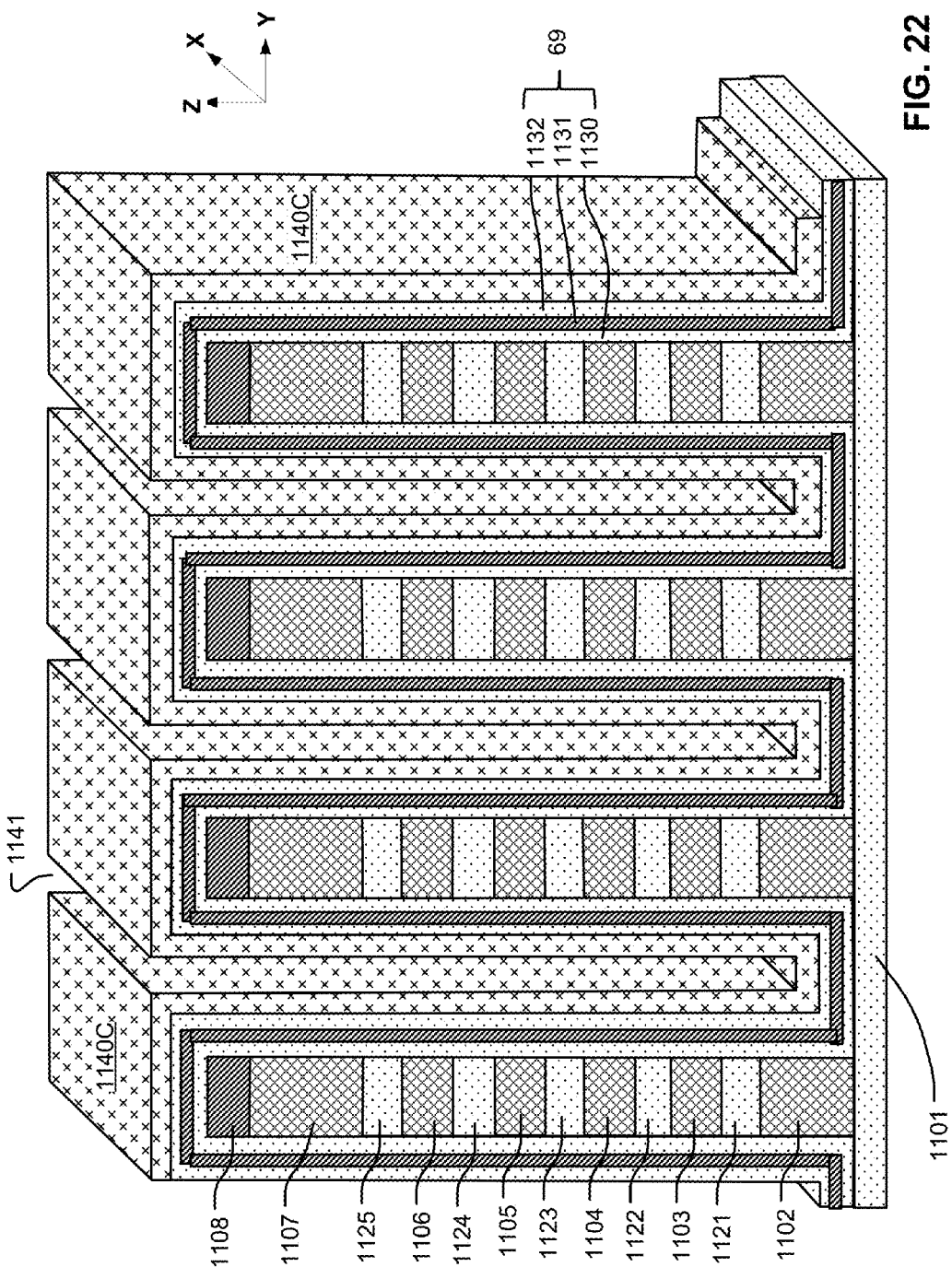
FIGS. 22-25 are perspective views illustrating additional structures during manufacturing stages for a 3D capacitor in the second embodiment, accompanying the process for the 3D memory block.

FIG. 22 illustrates a stage of the process flow after forming a conductive film having a surface conformal with the first insulator on the plurality of stacks so that a plurality of pillar is formed. A conductive film 1140C can be a doped semiconductor or a conductor so as to have low resistance. In an example of a doped semiconductor, conductive film 1140C can be formed with semiconductor film 1140 in the memory blocks as described with reference to FIG. 12, and followed by adding additives into the semiconductor to increase the conductivity. In another example, the doped semiconductor can be formed with additives in situ. In yet another example, a salicide process is further applied to the semiconductor film 1140 such that a silicide layer, like tungsten silicide, cobalt silicide, tungsten silicide, and titanium silicide, can lower the resistance. In an alternative example, conductive film 1140C can be a metal, such as tungsten, copper, titanium, other metal materials or combinations thereof. Conductive film 1140C has a plurality of vertical conductive films between the stacks acting as one plate of the 3D capacitor described herein. Thus, the lower resistance the plate of the capacitor, the greater capacitance the capacitor.

Figure 23:
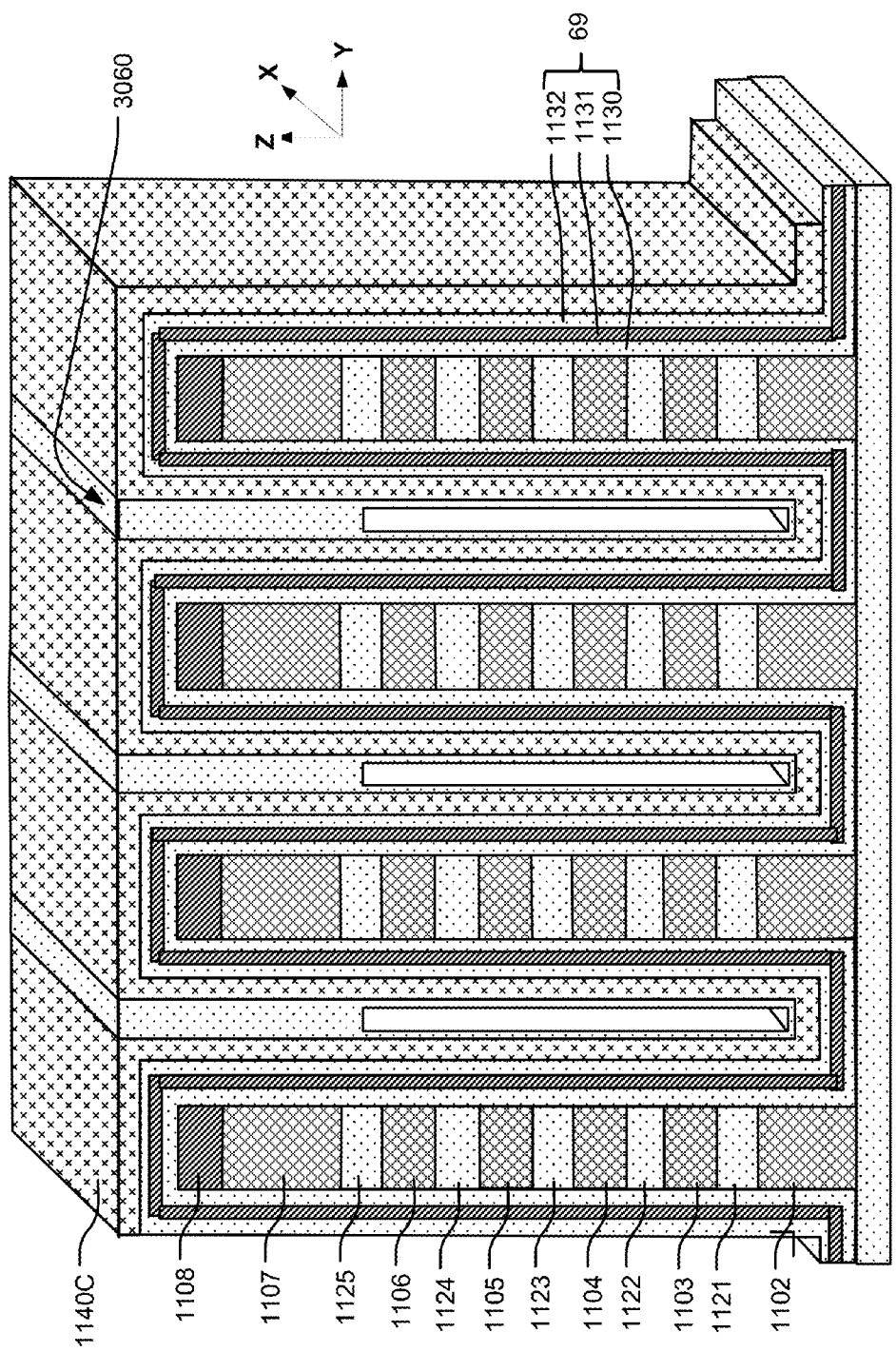

FIG. 23 illustrates a stage in the process flow after forming a step to fill the regions (e.g. 1141 of FIG. 22) between stacks with an insulating material. The fill step applied in the memory blocks as described with reference to FIG. 12 is also applied to the capacitor described herein. Fill structure 3060, similar to the fill structure 1060 of FIG. 12, is thus formed.

Figure 24:
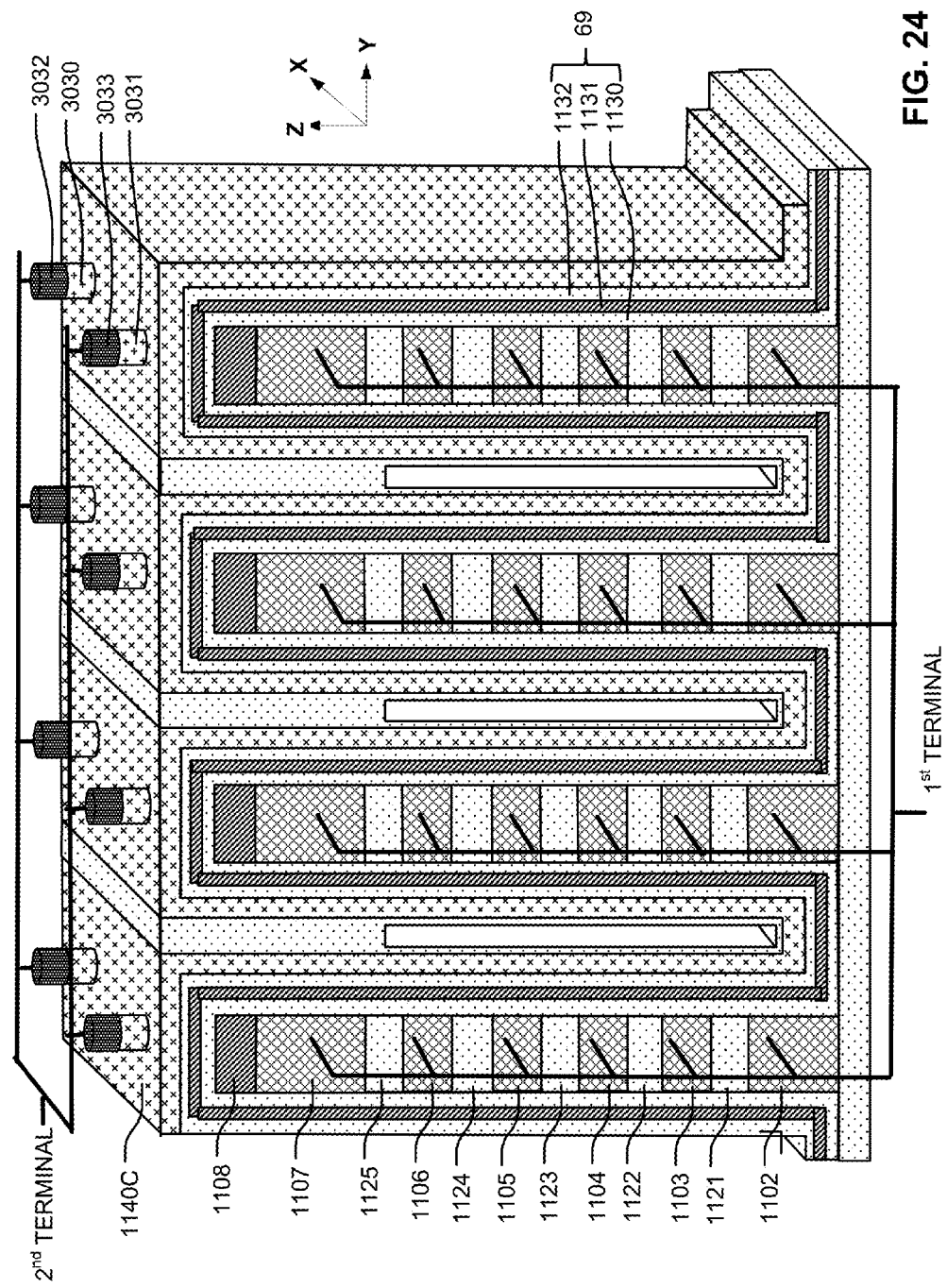

FIG. 24 illustrates a stage in the process flow after forming interlayer connectors (e.g. 3030, 3031) and inter-level connectors (e.g. 3032, 3033) on conductive film 1140C overlying the top of the stacks. In this example, the formation of interlayer connectors (e.g. 3030, 3031) on conductive film 1140C can be carried out in the step described with reference to FIG. 15, and the formation of inter-level connectors (e.g. 3032, 3033) on the interlayer connectors can be carried out in the step described with reference to FIG. 16. As schematically illustrated, the inter-level connectors (e.g. 3032, 3033) are conductively and passively connected together in the second patterned conductor layer, through which the second terminal of the 3D capacitor is connected to the vertical conductive films in the plurality of pillars disposed between the adjacent stacks. The first terminal of the 3D capacitor is connected to conductive strips 1102, 1103, 1104, 1105, 1106 and 1107 in each of the plurality of stacks through an intermediate connector and a staircase contact structure as described with reference to FIG. 21.

Figure 25:
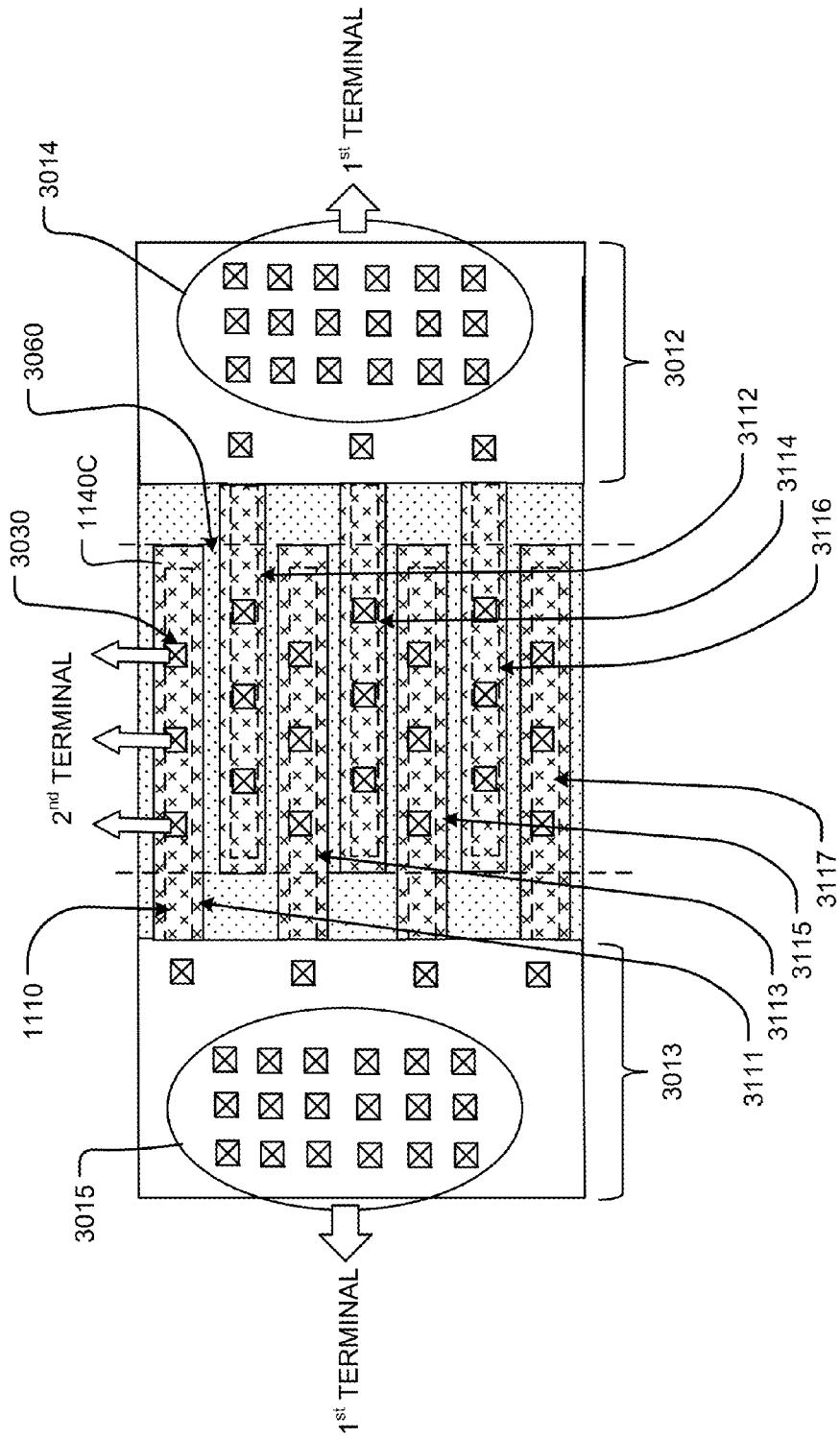

FIG. 25 illustrates a top view of the structure of FIG. 24. In the illustration, odd stacks 3111, 3113, 3115, and 3117 extend from the left side landing pad area 3013, and even stacks 3112, 3114 and 3116 extend from the right side landing pad area 3012. Conductive film 1140C overlies the stacks 3111, 3112, 3113, 3114, 3115, 3116, and 3117 but does not overlie the landing pad areas 3012 and 3013. The fill structure 3060 is disposed between the vertical conducive films on the opposing side of the adjacent stacks. The plurality of stacks has an interdigitated arrangement. The conductive strips in the even stacks are conductively and passively connected together, through right side contact region 3014, to the first terminal of the 3D capacitor, i.e. to the first node of the charge pump, or other circuit. Also, the conductive strips in the odd stacks are conductively and passively connected together, through contact region 3015, to the first terminal. As such, the conductive strips in the plurality of stacks, i.e. odd and even stacks, act as a first plate of the 3D capacitor. In this example, the contact plugs in contact regions 3014 and 3015 are connected in the first patterned conductor layer. On the other hand, the vertical conductive films in the plurality of pillars are conductively and passively connected together, through the plurality of connectors, to a second terminal of the 3D capacitor, i.e. to the second node of the charge pump, or other circuit, whereby vertical conductive film acts as a second plate of the 3D capacitor. In this example, the plurality of inter-level connectors is connected in the second patterned conductor layer.

Figure 26:
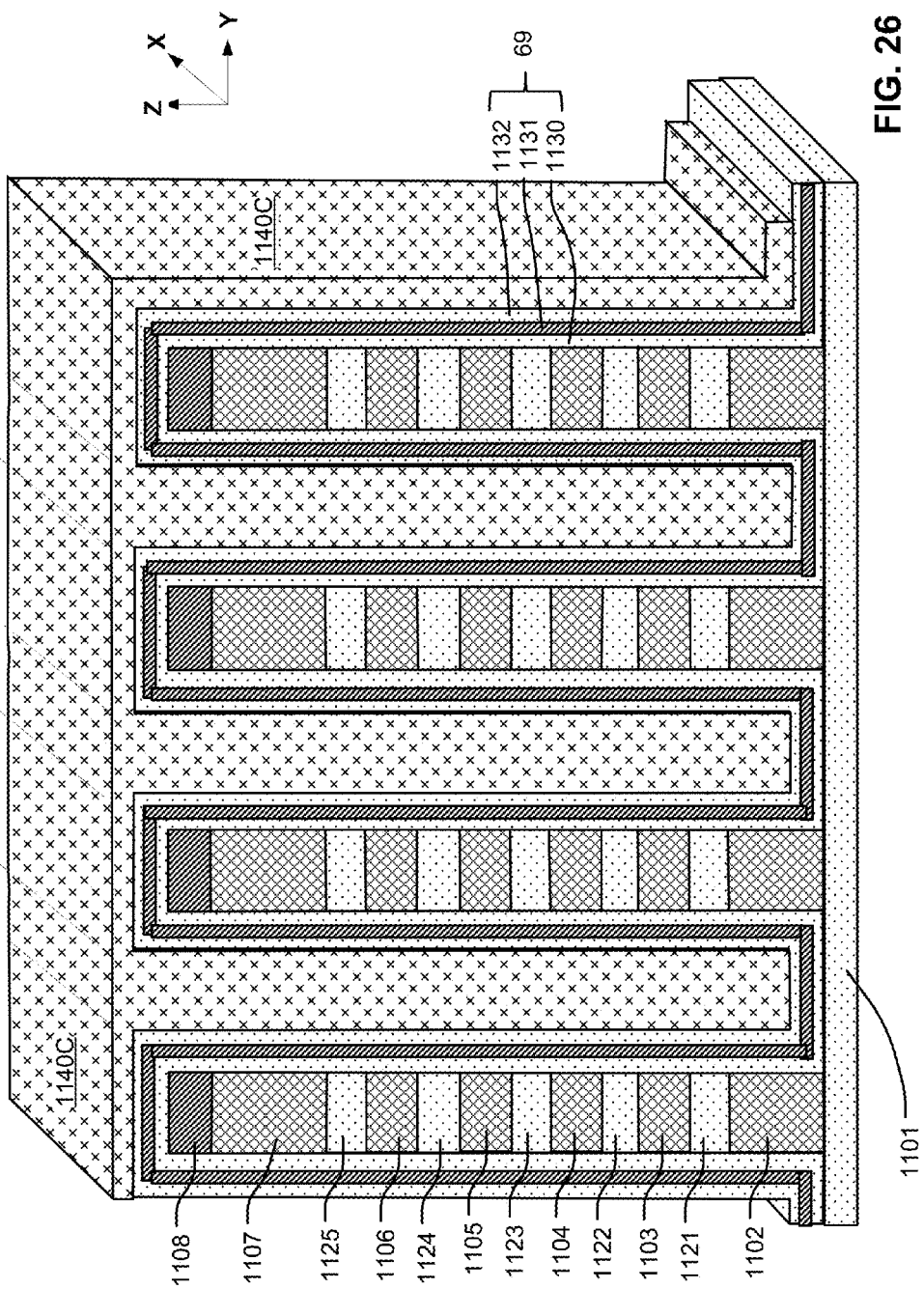
FIG. 26 illustrates a variant of the 3D capacitor in the second embodiment.

FIG. 26 illustrates a variant of the 3D capacitor of the second embodiment. In this illustration, the regions (e.g. 1141 of FIG. 22) between stacks are filled with conductive film 1140C such that the entire top surface of the illustrated structure is conductive. Then, it provides more space to include the intermediate and inter-level connectors and eliminates the misalignment issue of placing the connectors on the fill structure 3060 between stacks.

D. 3D Capacitors of the Third Embodiment

FIGS. 27 through 31 illustrate an example process flow of manufacturing a 3D capacitor of the third embodiment.

Figure 27:
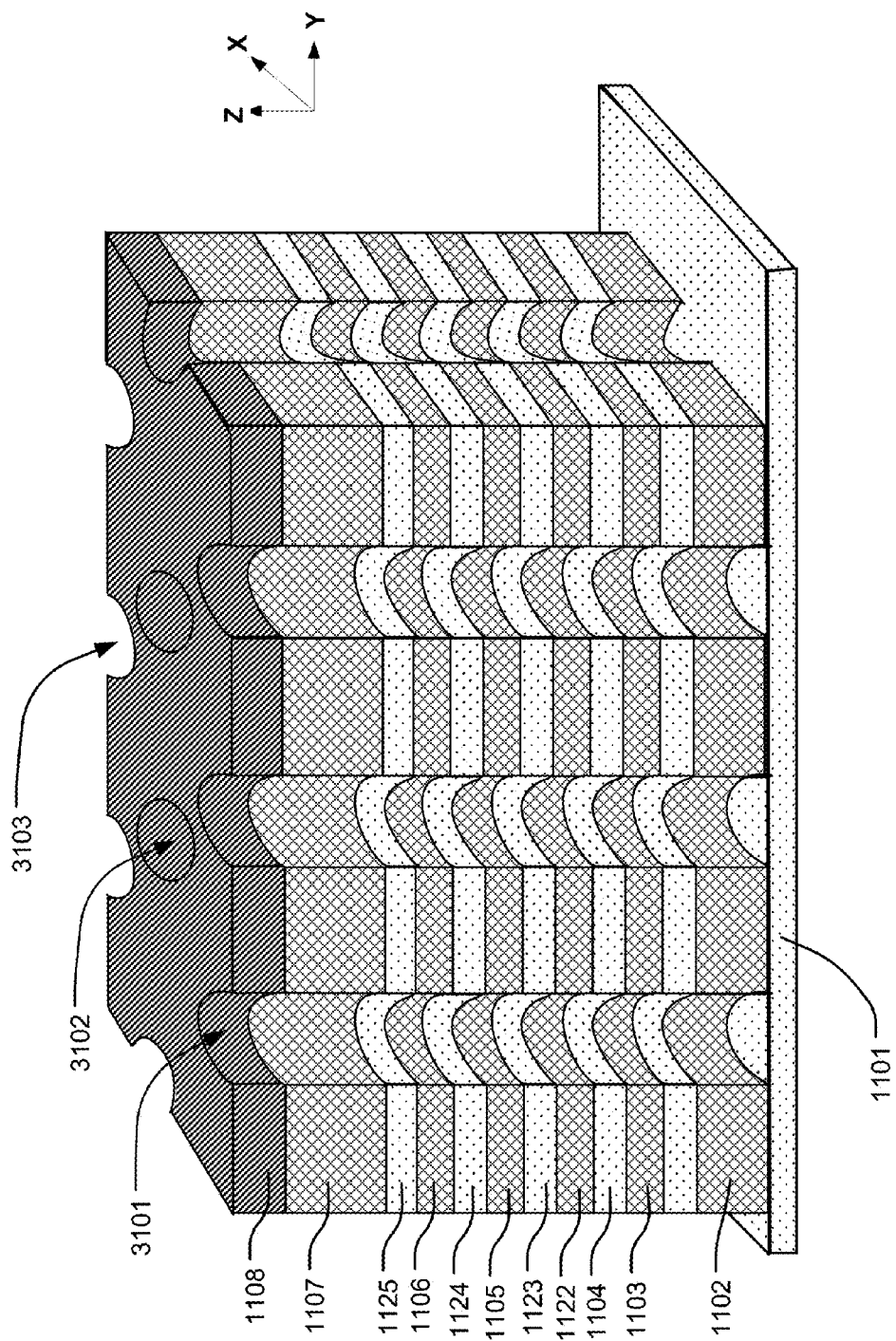
FIGS. 27-31 are perspective views illustrating additional structures during manufacturing stages for a 3D capacitor in the third embodiment, accompanying the process for the 3D memory block.

FIG. 27 illustrates a stage in the process flow after forming a plurality of holes, arranged in a twisted or honeycomb pattern, through the stack of conductive strips 1102, 1103, 1104, 1105, 1106, and 1107 alternating with insulating strips 1121, 1122, 1123, 1124, 1125, and 1108. To from the structure shown in FIG. 28, a plurality of conductive layers alternating with insulating layers is deposited over an insulating layer 1101 on a substrate (now shown). After the plurality of layers is formed, a patterned etch, stopping at insulating layer 1101, is applied to form a plurality of holes (e.g. 3101, 3102, and 3103) through the conductive strips 1102, 1103, 1104, 1105, 1106, and 1107 in one or more stacks. For the sake of simplicity, only one stack is illustrated in FIG. 27. Formation of the plurality of holes can be carried out at the step of formation of the plurality of stacks in the memory blocks.

Figure 28:
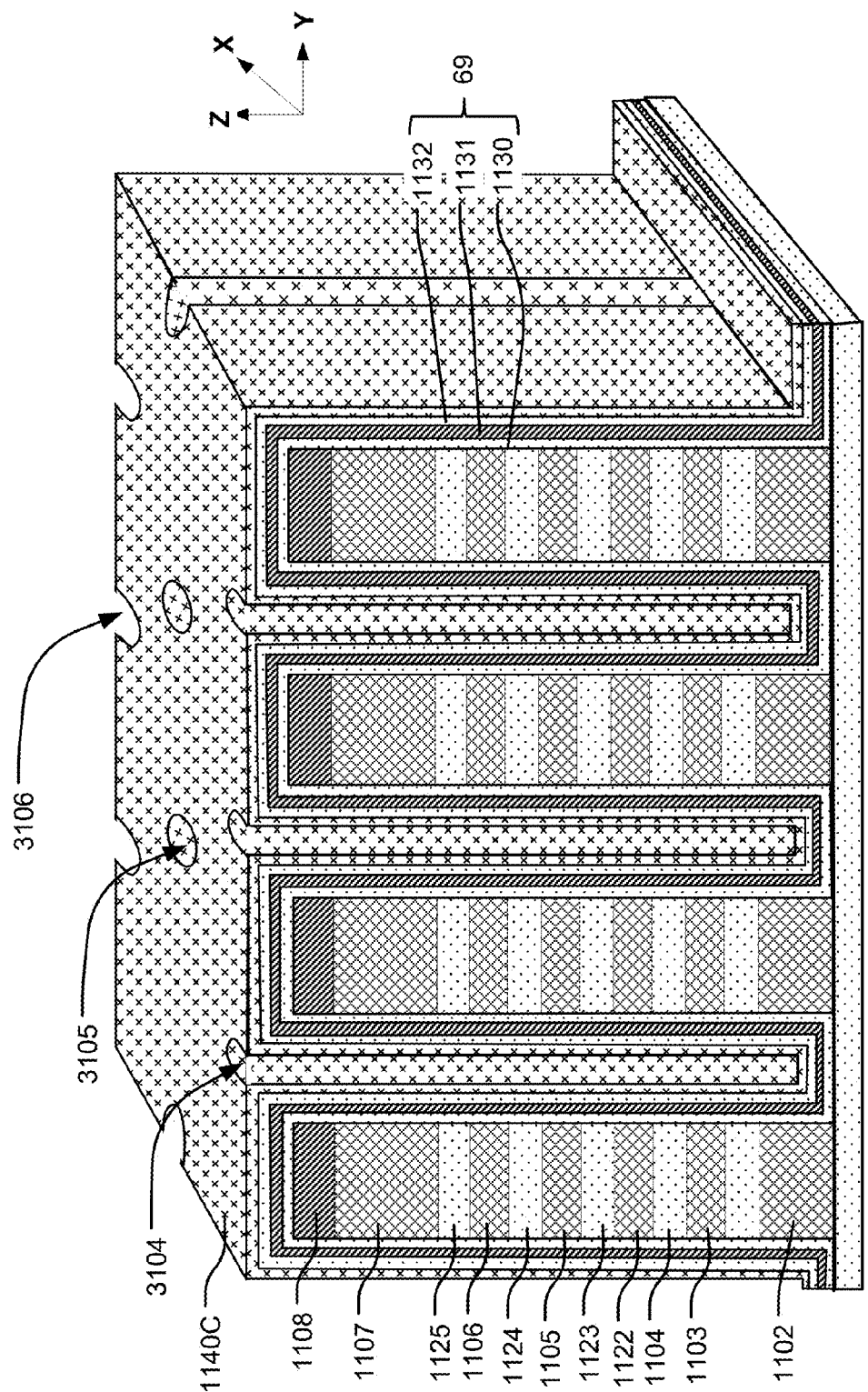

FIG. 28 illustrates a stage of the process flow after forming a first insulator 69 and conductive film 1140C overlying the plurality of holes so as to form a plurality of pillars contacting the sidewalls of the conductive strips. Formation of first insulator 69 and conductive film 1140C does not completely fill the holes, leaving regions (e.g. 3104, 3105, and 3106) in the holes. Formation of first insulator 69 can be carried out by the step described with reference to FIG. 10, and formation of conductive film 1140C can be carried out by the step described with reference to FIG. 23.

Figure 29:
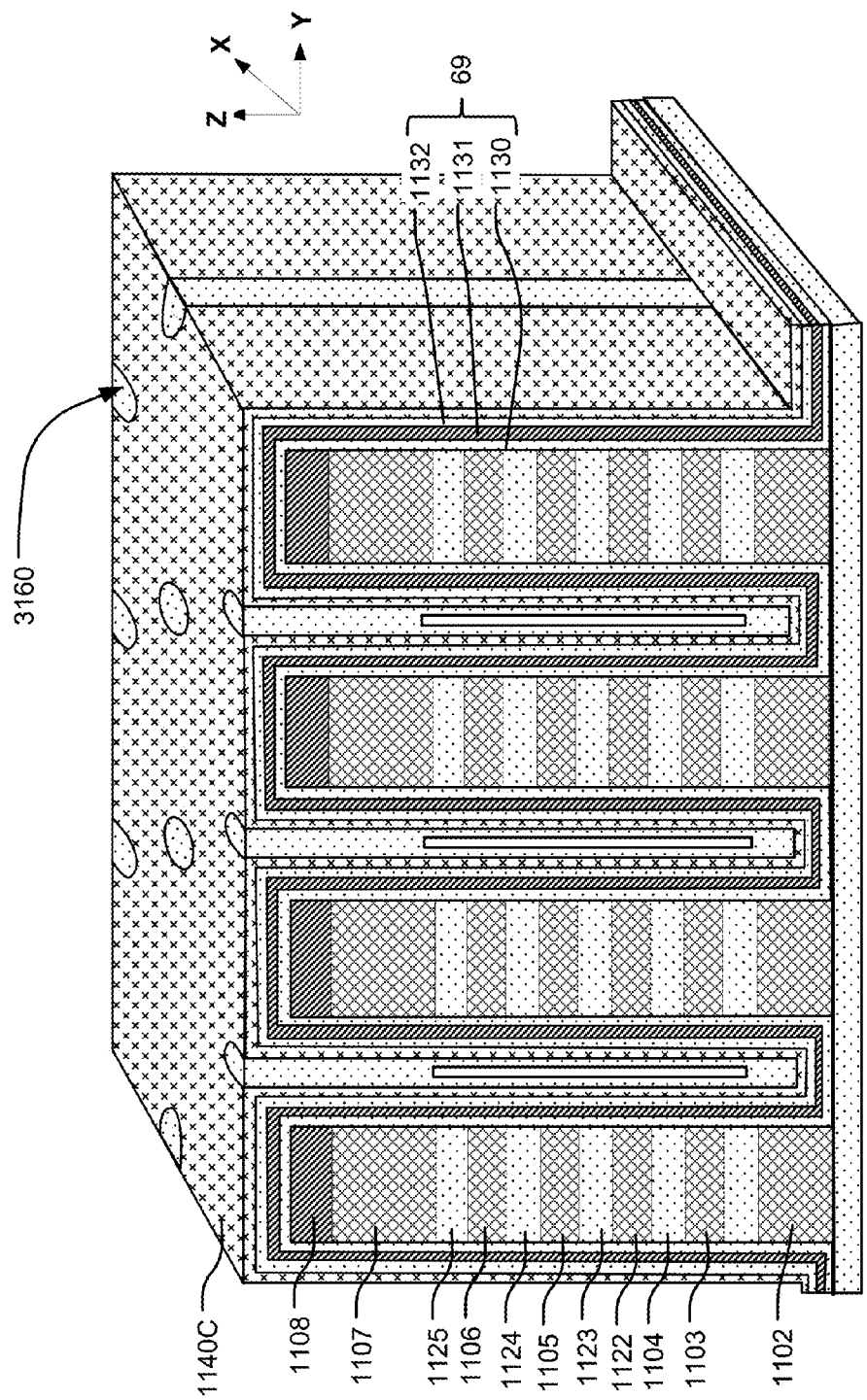

FIG. 29 illustrates a stage of the process flow after forming step to fill the regions (e.g. 3104, 3105, and 3106 of FIG. 28) with an insulating material. The fill step applied in the memory blocks as described with reference to FIG. 11 is also applied to the capacitor described herein. Fill structure 3160, similar to the fill structure 1060 of FIG. 11, is thus formed.

Figure 30:
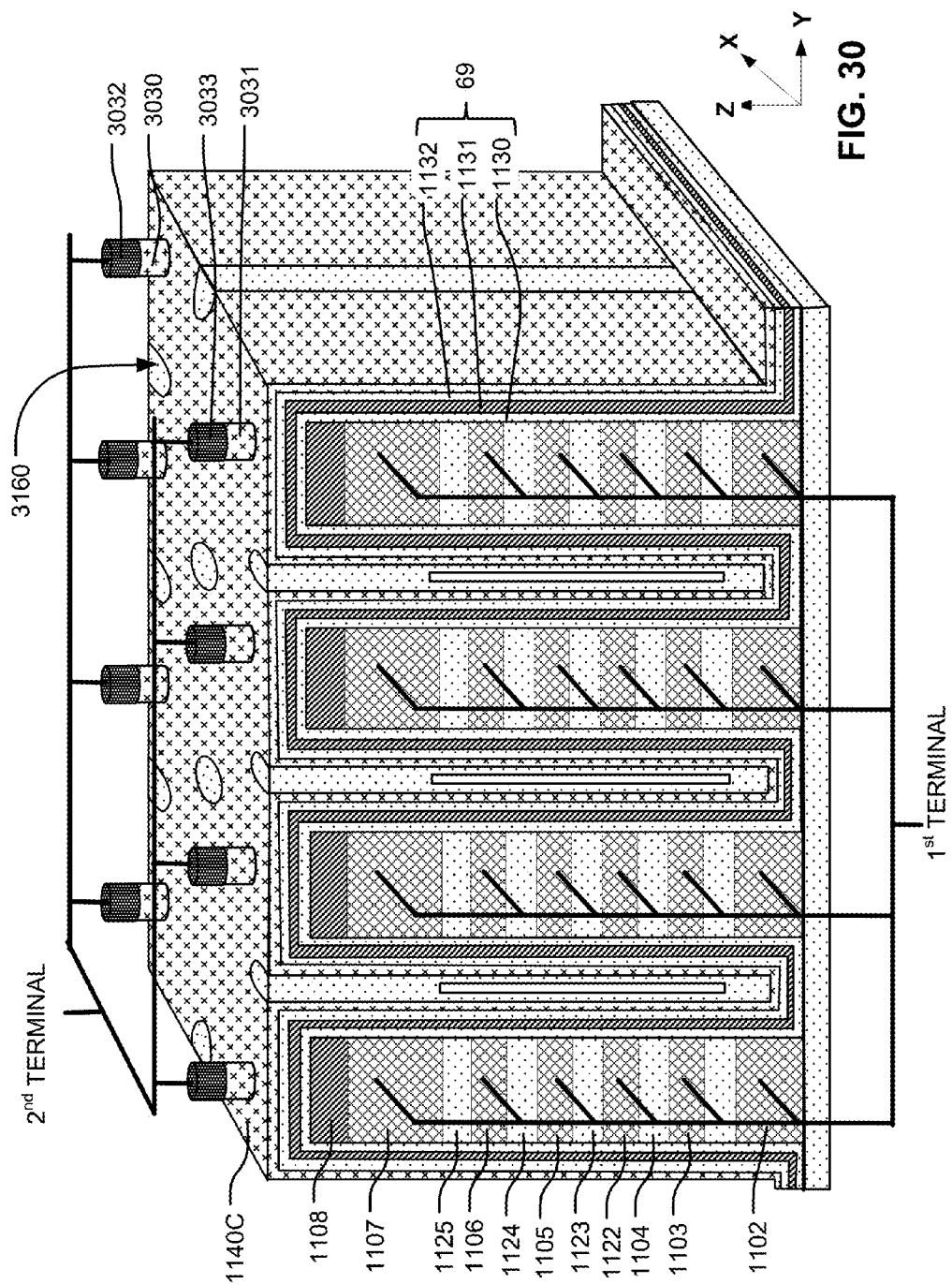

FIG. 30 illustrates a stage in the process flow after forming interlayer connectors (e.g. 3030, 3031) and inter-level connectors (e.g. 3032, 3033) on conductive film 1140C overlying the top of the stacks. In this example, the formation of interlayer connectors (e.g. 3030, 3031) can be carried out in the step described with reference to FIG. 15, and the formation of inter-level connectors 3032, 3033 can be carried out in the step described with reference to FIG. 16. As schematically illustrated, the inter-level connectors (e.g. 3032, 3033) are conductively and passively connected together in the second patterned conductor layer, through which the second terminal of the 3D capacitor is connected to the vertical conductive films in the plurality of pillars disposed in the stack. The first terminal of the 3D capacitor is connected to conductive strips 1102, 1103, 1104, 1105, 1106 and 1107 in the stack through an intermediate connecter and a staircase contact structure as described with reference to FIG. 21.

Figure 31:
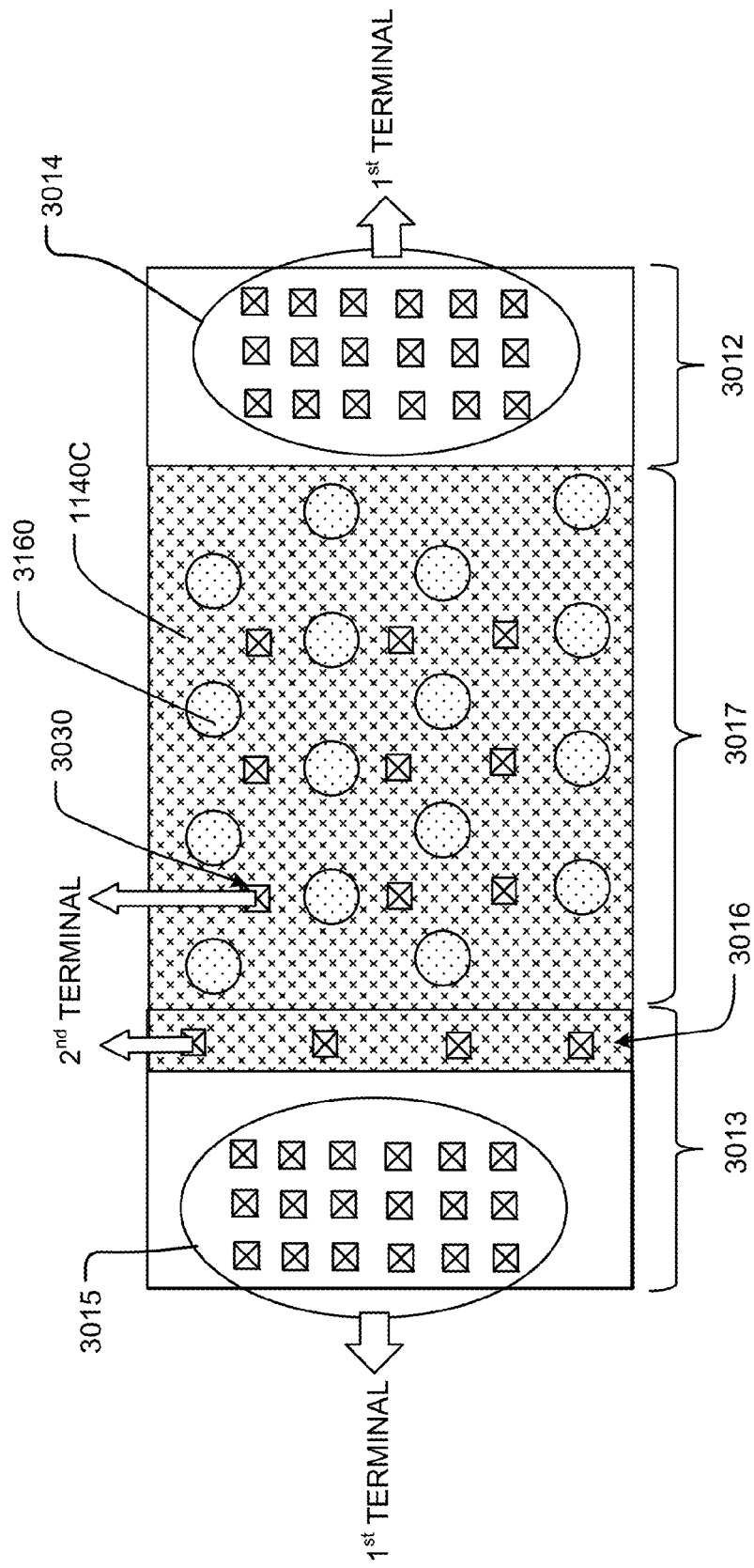

FIG. 31 illustrates a top view of the structure of FIG. 30. In the illustration, the stack comprises a right side landing pad area 3012 and a left side landing pad area 3013. In another example, the right side landing pad area 3012 can optionally eliminated such that more pillars can be formed to increase the capacitance. Conductive film 1140C overlies the plurality of holes in the stack, and can optionally cover the region 3016 of landing pad area 3013 so that more connectors to the second terminal can be to formed. The plurality of pillars along with the fill structures (e.g. 3160) within the pillars has a twisted or honeycomb arrangement in the stack. The conductive strips in the stack are conductively and passively connected together, through right side contact regions 3014 in the right side landing pad area 3012 and left side contact regions 3015 in the left side landing pad area 3013, to the first terminal of the 3D capacitor, i.e. to the first node of the charge pump, or other circuit. As such, the conductive strips act as a first plate of the 3D capacitor. In this example, the contact plugs in contact regions 3014 and 3015 are connected in the first patterned conductor layer. On the other hand, the vertical conductive films in the plurality of pillars are conductively and passively connected together, through the plurality of connectors, to a second terminal of the 3D capacitor, i.e. to the second node of the charge pump, or other circuit, whereby vertical conductive film acts as a second plate of the 3D capacitor. In this example, the plurality of inter-level connectors is connected in the second patterned conductor layer.

Figure 32:
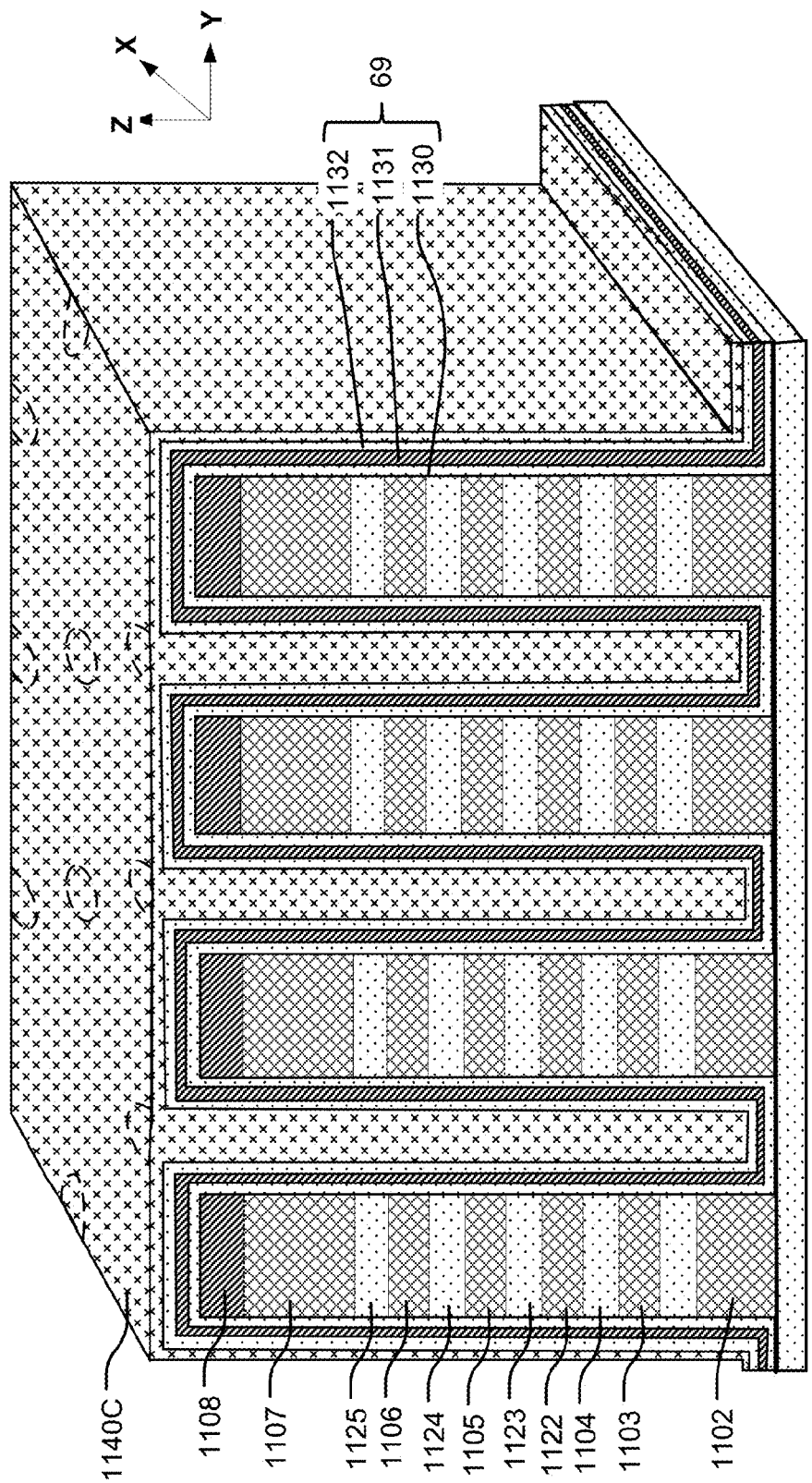
FIG. 32 illustrates a variant of the 3D capacitor in the third embodiment.

FIG. 32 illustrates a variant of the 3D capacitor of the third embodiment. In this illustration, the regions (e.g. 3104, 3105, and 3106 of FIG. 28) within the holes in the stack are filled with conductive film 1140C such that the entire top surface of the illustrated structure is conductive. So, this variant provides more space to include the intermediate and inter-level connectors and eliminates the misalignment issue of placing the connectors on the fill structure 3160 within the pillar.

Figure 33:
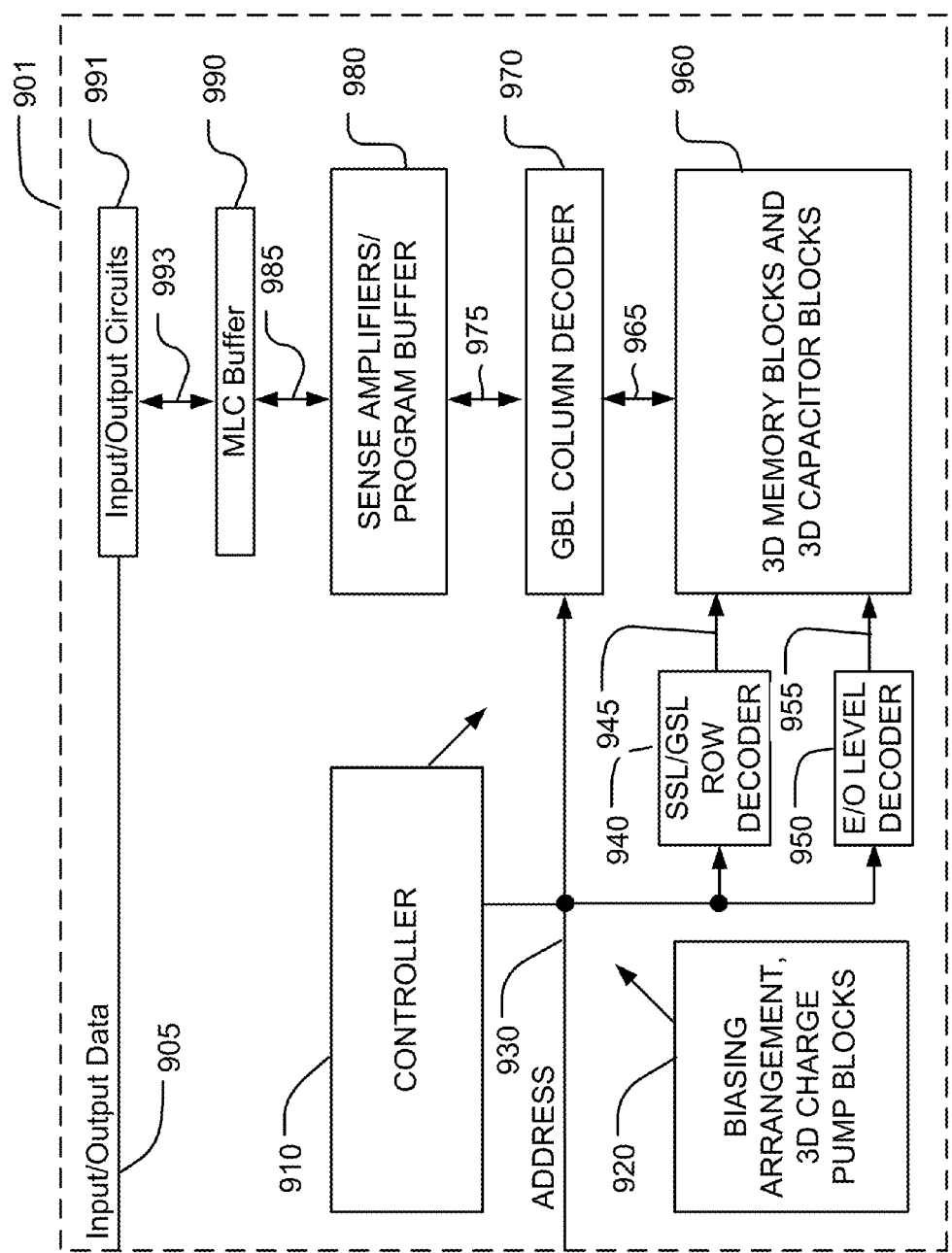
FIG. 33 is a block diagram of an integrated circuit including a 3D memory block and a 3D capacitor as described herein.

FIG. 33 is a simplified chip block diagram of an integrated circuit 901 including a 3D NAND flash memory. The integrated circuit 901 includes a memory array 960 including one or more 3D memory blocks as described herein on an integrated circuit substrate.

An SSL/GSL decoder 940 is coupled to a plurality of SSL/GSL lines 945, arranged in the memory array 960. An even/odd level decoder 950 is coupled to a plurality of even/odd word lines 955. A global bit line column decoder 970 is coupled to a plurality of global bit lines 965, arranged along columns in the memory array 960 for reading data from and writing data to the memory array 960. The global bit lines are configured to bit lines 2060-2062 with associated extensions 2041-2043, 2045-2046 as illustrated in FIG. 16. Addresses are supplied on bus 930 from control logic 910 to decoder 970, decoder 940 and decoder 950. Sense amplifier and program buffer circuits 980 are coupled to the column decoder 970, in this example via first data lines 975. The program buffer in circuits 980 can store program codes for multiple-level programming, or values that are a function of the program codes, to indicate program or inhibit states for selected bit lines. The column decoder 970 can include circuits for selectively applying program and inhibit voltages to bit lines in the memory in response to the data values in the program buffer.

Sensed data from the sense amplifier/program buffer circuits 980 are supplied via second data lines 985 to multi-level data buffer 990, which is in turn coupled to input/output circuits 991 via a data path 993. Also, input data is applied in this example to the multi-level data buffer 990 for use in support of multiple-level program operations for each of the independent sides of the independent double gate cells in the array.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the 3D memory blocks and 3D capacitor blocks 960.

In the example shown in FIG. 33, control logic 910 enables the charge pump and using the charge pump to generate positive and negative voltages for read, erase, and program operations, and controls the application of supply voltages generated or provided through the voltage supply or supplies in block 920, such as read, erase, verify and program bias voltages. The control logic 910 is coupled to the multi-level data buffer 990 and the 3D memory blocks and 3D capacitor blocks 960. The control logic 910 includes logic to control multiple-level program operations. In embodiments supporting the U-shaped vertical NAND structures described herein, the logic is configured to perform the method of:

selecting a layer of memory cells in the array, such as using a word line layer decoder;
selecting a side of the vertical channel structures in the selected layer such as by selecting an even or odd side word line structure;
selecting vertical channel structures in a selected row in the array such as by using SSL switches and GSL switches on the rows of vertical channel structures; and
storing charge in charge trapping sites in the selected layer on the selected side of vertical channel structures in one or more selected columns in the array, to represent data using bit line circuitry like page buffers on global bit lines coupled to the selected row of vertical channel structures.

In some embodiments, the logic is configured to select a layer and select a side by selecting one of even and odd interdigitated word line structures in the selected layer of the array, such as by controlling even and odd word line layer decoders.

In some embodiments, the logic is configured to store multiple levels of charge to represent more than one bit of data in the charge trapping sites in the selected layer on the selected side. In this manner, a selected cell in a selected frustum of a vertical channel structure in the array stores more than two bits, including more than one bit on each side of the cell.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The 3D memory blocks and 3D capacitor blocks 960 can comprise charge trapping memory cells configured to store multiple bits per cell, by the establishment of multiple program levels that correspond to amounts of charge stored, which in turn establish memory cell threshold voltages $V_T$. As mentioned above, single-bit-per-cell embodiments can include the structures described herein.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A 3D capacitor, comprising:
a plurality of stacks of conductive strips alternating with insulating strips;
a first terminal connected to conductive strips in the stacks in a first set of every other stack in the plurality of stacks; and
a second terminal connected to conductive strips in the stacks in a second set of every other stack in the plurality of stacks.

2. The 3D capacitor of claim 1, wherein the stacks in the first set of every other stack are interdigitated with the stacks in the second set of every other stack.

3. The 3D capacitor of claim 1, wherein the conductive strips in the stacks in the first set of every other stack are conductively and passively connected together and act as a first plate of the 3D capacitor, and the conductive strips in the stacks in the second set of every other stack are conductively and passively connected together and act as a second plate of the 3D capacitor.

4. The 3D capacitor of claim 1, wherein the conductive strips in the stacks in the first set and second set of every other stack in the plurality of stacks are in consecutive levels and connected together without an intervening conductive strip between the conductive strips.

5. A 3D capacitor, comprising:
one or more stacks of conductive strips alternating with insulating strips;
a plurality of pillars respectively including a vertical conductive film and a first insulator;
a first terminal connected to conductive strips in the one or more stacks; and
a second terminal connected to the vertical conductive films in the plurality of pillars.

6. The 3D capacitor of claim 5, wherein the conductive strips in the one or more stacks are conductively and passively connected together and act as a first plate of the 3D capacitor, and the vertical conductive films in the plurality of pillars are conductively and passively connected together and act as a second plate of the 3D capacitor.

7. The 3D capacitor of claim 5, wherein the plurality of pillars has a twisted or honeycomb arrangement.

8. A 3D capacitor, comprising:
a plurality of stacks of conductive trips alternating with insulating strips;
a first terminal connected to conductive strips in consecutive levels in one or more stacks in the plurality of stacks; and
a second terminal insulated from the first terminal,
wherein the conductive strips in the one or more stacks in the plurality of stacks are connected together without any intervening conductive strips disposed between the conductive strips in consecutive levels in the one or more stacks in the plurality of stacks.

9. The 3D capacitor of claim 8, wherein the second terminal is connected to conductive strips in consecutive levels in stacks interdigitated with the stacks including the conductive strips in consecutive levels connected to the first terminal.

10. The 3D capacitor of claim 8, wherein the second terminal is connected to a plurality of pillars disposed between the adjacent stacks in the plurality of stacks.

11. The 3D capacitor of claim 8, wherein the second terminal is connected to a plurality of pillars having a twisted or honeycomb arrangement.

12. A method of manufacturing a 3D capacitor, comprising:
    forming a plurality of stacks of conductive strips alternating with insulating strips;
    forming a first terminal of the 3D capacitor connected to conductive strips in consecutive levels in one or more stacks in the plurality of stacks; and
    forming a second terminal of the 3D capacitor insulated from the first terminal,
    wherein said forming second terminal includes connecting the conductive strips in consecutive levels in stacks interdigitated with the one or more stacks comprising the conductive strips in consecutive levels connected to the first terminal.

13. The method of claim 12, wherein said forming second terminal includes forming a plurality of pillars between the adjacent stacks in the plurality of stacks.

14. The method of claim 12, wherein said forming second terminal includes forming a plurality of pillars having a twisted or honeycomb arrangement.

15. A method for manufacturing a 3D capacitor, comprising:
    forming a plurality of stacks of conductive strips alternating with insulating strips;
    forming a first terminal connected to conductive strips in the stacks in a first set of every other stack in the plurality of stacks; and
    forming a second terminal connected to conductive strips in the stacks in a second set of every other stack in the plurality of stacks.

16. A method for manufacturing a 3D capacitor, comprising:
    forming one or more stacks of conductive strips alternating with insulating strips;
    forming a plurality of pillars respectively including a vertical conductive film and a first insulator;
    forming a first terminal connected to the conductive strips in the one or more stacks; and
    forming a second terminal connected to the vertical conductive films in the plurality of pillars.

17. The method of claim 16, wherein said forming the second terminal includes forming a plurality of pillars having a twisted or honeycomb arrangement.

18. The method of claim 16, wherein said forming the second terminal includes forming a plurality of pillars respectively disposed on sides of stack in the one or more stacks.

* * * * *